United States Patent
Ogawa

(10) Patent No.: US 9,621,828 B2
(45) Date of Patent: Apr. 11, 2017

(54) IMAGING APPARATUS, CONTROL METHOD FOR IMAGING APPARATUS, AND NON-TRANSITORY COMPUTER-READABLE STORAGE MEDIUM

(71) Applicant: CANON KABUSHIKI KAISHA, Tokyo (JP)

(72) Inventor: Takeshi Ogawa, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 3 days.

(21) Appl. No.: 14/739,648

(22) Filed: Jun. 15, 2015

(65) Prior Publication Data
US 2015/0365639 A1 Dec. 17, 2015

(30) Foreign Application Priority Data

Jun. 16, 2014 (JP) ................................. 2014-123814
Jul. 14, 2014 (JP) ................................. 2014-144568
May 1, 2015 (JP) ................................. 2015-094444

(51) Int. Cl.
H04N 5/367 (2011.01)
H04N 5/369 (2011.01)
H04N 9/04 (2006.01)

(52) U.S. Cl.
CPC ......... H04N 5/3675 (2013.01); H04N 5/3696 (2013.01); H04N 9/045 (2013.01)

(58) Field of Classification Search
CPC ............... H04N 5/3675; H04N 5/3696; H04N 5/23212; H04N 9/045; G06T 3/4015
USPC ............. 348/242, 345, 349, 273, 294, 222.1
See application file for complete search history.

(56) References Cited

U.S. PATENT DOCUMENTS

| 6,781,632 B1* | 8/2004 | Ide | H04N 5/3696 348/345 |
| 7,711,261 B2* | 5/2010 | Kusaka | H04N 9/045 396/111 |
| 8,049,801 B2* | 11/2011 | Kusaka | H04N 5/3696 348/294 |
| 8,520,132 B2* | 8/2013 | Amano | H04N 5/23212 348/349 |
| 2007/0237512 A1* | 10/2007 | Kusaka | H04N 5/23212 348/E5.045 |
| 2013/0293763 A1* | 11/2013 | Shoda | H04N 5/23212 348/345 |

FOREIGN PATENT DOCUMENTS

| JP | 2007-279597 A | 10/2007 |
| JP | 2010-243772 A | 10/2010 |

* cited by examiner

Primary Examiner — Nhan T Tran
(74) Attorney, Agent, or Firm — Cowan, Liebowitz & Latman, P.C.

(57) ABSTRACT

An imaging apparatus comprising an image sensor including a plurality of focus detection pixels for generating a focus detection image and a plurality of imaging pixels for generating a captured image, a color ratio detection unit detecting a color ratio based on a pixel value output from a pixel in a position surrounding a processing target pixel, a color conversion unit generating a first pixel value by applying color conversion with the color ratio to a pixel value output from a pixel that is located in the predetermined direction of the processing target pixel, and an adding unit generating a third pixel value by adding a second pixel value output from the processing target pixel with the first pixel value having the same color as the second pixel value.

9 Claims, 23 Drawing Sheets

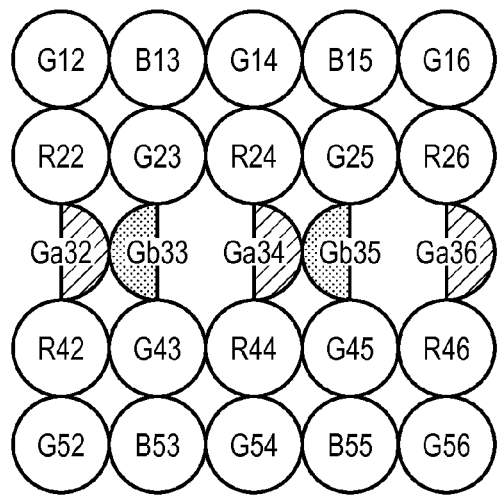
F I G. 22A
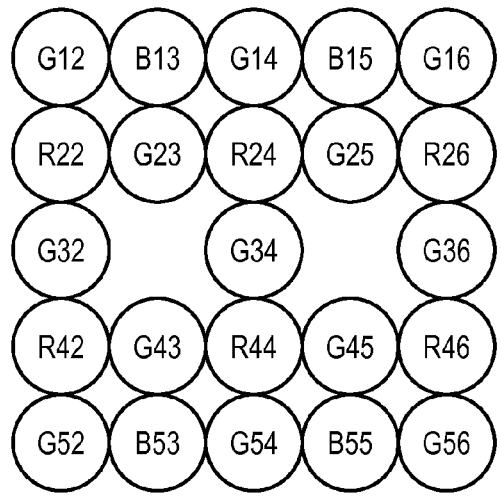
F I G. 22B
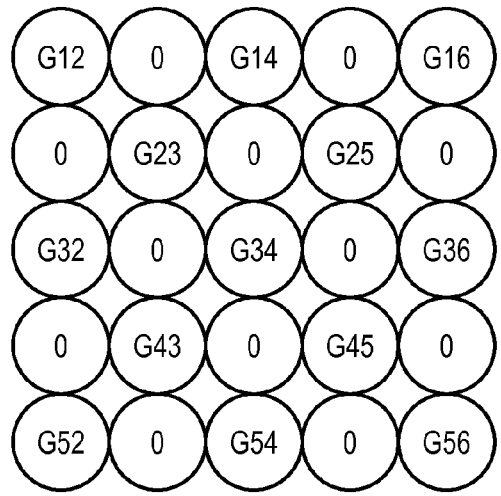
F I G. 22C

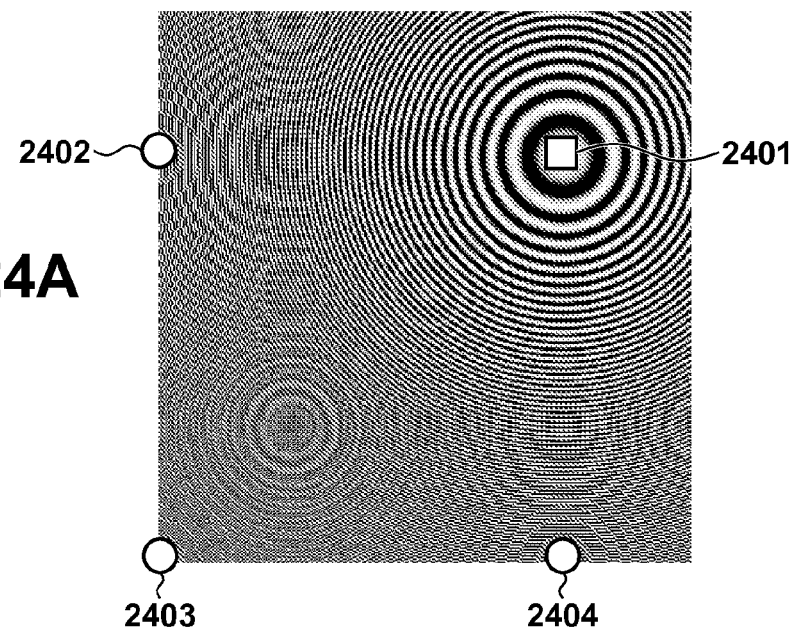
F I G. 24A
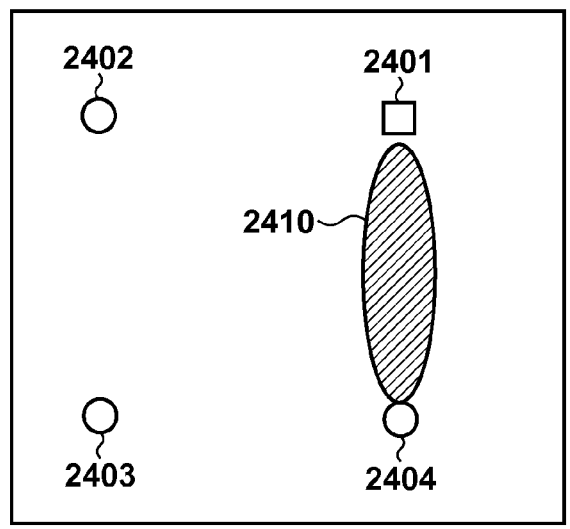
F I G. 24B
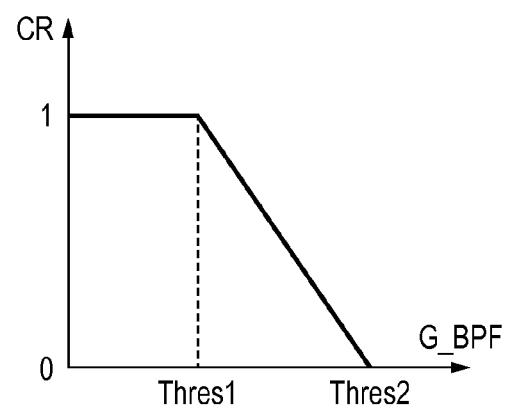
F I G. 24C

IMAGING APPARATUS, CONTROL METHOD FOR IMAGING APPARATUS, AND NON-TRANSITORY COMPUTER-READABLE STORAGE MEDIUM

BACKGROUND OF THE INVENTION

Field of the Invention

The present invention relates to an imaging apparatus, a control method for an imaging apparatus, and a non-transitory computer-readable storage medium.

Description of the Related Art

A pupil division phase difference method is one of focus detection techniques. This method forms a pair of divided images by dividing a pencil of light passing through an imaging lens. A defocus amount and a defocus direction of the imaging lens can be detected by detecting pattern misalignment in the pair of divided images. Some solid-state image sensors have an image sensor including pixels provided with light blocking layers, and use such pixels as focus detection pixels, based on the foregoing principle.

Some image sensors have an image sensor including pixels provided with light blocking layers, and use such pixels as focus detection pixels. Japanese Patent Laid-Open No. 2007-279597 discloses a method for obtaining image data in a position of a focus detection pixel by obtaining a pixel value interpolated using surrounding imaging pixels and a pixel value of the focus detection pixel with the use of an image sensor in which focus detection pixels are embedded among imaging pixels. This method could possibly trigger deterioration in the image quality.

On the other hand, Japanese Patent Laid-Open No. 2010-243772 discloses a technique to use signals from focus detection pixels as imaging signals. A focus detection pixel obtains a pupil-divided image by blocking a part of a pencil of light passing through an imaging lens, and obtains an imaging signal pixel by interpolating a signal corresponding to a light blocking portion using surrounding pixels in which light blocking portions and open portions are reversed compared with the focus detection pixel.

SUMMARY OF THE INVENTION

However, with the conventional techniques disclosed in the above-mentioned documents, half of components of a pixel value are interpolating using surrounding pixels, and therefore half of signal components have reduced frequency characteristics due to the low-pass effect. Especially, when a subject has repetitive patterns of high-frequency components near the Nyquist frequency, a resultant image undesirably turns out to be unnatural because blurring occurs only in a portion where focus detection pixels are arranged. Furthermore, in Japanese Patent Laid-Open No. 2010-243772 mentioned above, focus detection pixels of the same color are used, and therefore correction cannot be performed using pixels neighboring in the up, down, left, and right directions; as a result, reproducibility of high-frequency components is lowered.

In view of this, one aspect of embodiments of the present invention improves reproducibility of high-frequency components of a pixel signal in a position of a focus detection pixel.

According to some embodiments, an imaging apparatus is provided. The imaging apparatus comprises an image sensor including a plurality of focus detection pixels for generating a focus detection image and a plurality of imaging pixels for generating a captured image in which showing an imaged subject is captured, the plurality of focus detection pixels being arrayed in a predetermined direction in such a manner that different colors thereof alternate, a color ratio detection unit configured to detect a color ratio based on a pixel value output from a pixel in a position surrounding a processing target pixel, a color conversion unit configured to generate a first pixel value by applying color conversion, using the color ratio, to a pixel value output from a pixel that is distanced from located the processing target pixel in the predetermined direction of the processing target pixel, and an addition unit configured to generate a third pixel value by adding a second pixel value output from the processing target pixel with the first pixel value having the same color as the second pixel value.

Further features of the present invention will become apparent from the following description of exemplary embodiments (with reference to the attached drawings).

BRIEF DESCRIPTION OF THE DRAWINGS

FIGS. 22A to 22C represent a flowchart for describing a 0-inserted G image according to the sixth embodiment of the invention.

FIGS. 24A to 24C are diagrams for describing a method for calculating a combining ratio according to the sixth embodiment of the invention.

DESCRIPTION OF THE EMBODIMENTS

The following describes embodiments of the invention with reference to the attached drawings.

First Embodiment

Figure 1:
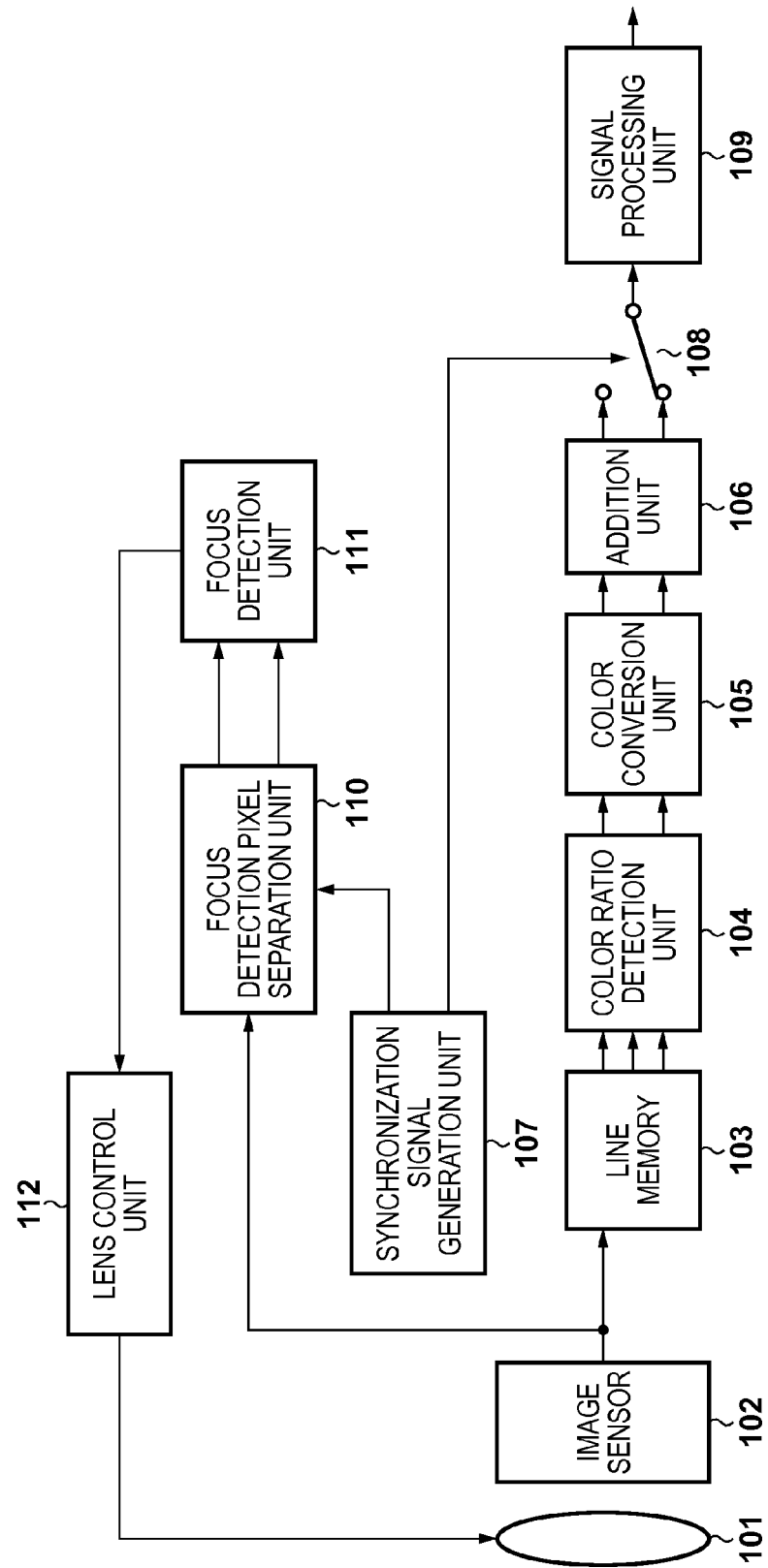
FIG. 1 is a block diagram showing an example configuration of an imaging apparatus according to a first embodiment of the invention.

FIG. 1 is a block diagram showing an example configuration of an imaging apparatus according to an embodiment of the invention. This imaging apparatus can be configured as, for example, a digital camera; however, this imaging apparatus is not limited to a digital camera as long as it uses an image sensor including imaging pixels and focus detection pixels. Examples of such an imaging apparatus include a digital video camera, a personal computer, a mobile telephone, a smartphone, a PDA, and a tablet terminal.

In FIG. 1, the imaging apparatus is configured as follows. An image sensor 102 converts an optical image formed by an imaging lens 101 into an electrical signal. It is assumed that the image sensor 102 is constituted by a CCD or CMOS sensor, and is composed of a set of a plurality of pixels compliant with the Bayer arrangement shown in FIG. 7A. Pixel signals output from the image sensor 102 are accumulated in a line memory 103 and output to a color ratio detection unit 104. As will be described with reference to FIGS. 3A and 3B, the color ratio detection unit 104 generates a color ratio signal based on the input pixel signals, and outputs the color ratio signal together with a pixel signal.

The output from the image sensor 102 is also supplied to a focus detection pixel separation unit 110. As will be described with reference to FIGS. 4A and 4B, a color conversion unit 105 applies cover conversion to the pixel signal supplied from the color ratio detection unit 104 using the color ratio signal, and supplies the result of the color conversion to an addition unit 106. As will be described with reference to FIG. 5, the addition unit 106 generates an added image based on a color conversion value input from the color conversion unit 105 and the pixel signal (through image) that has been through-output from the same, and outputs the added image together with the through image. A switch 108 selects one of the added image and the through image input from the addition unit 106, and supplies the selected image to a signal processing unit 109. The signal processing unit 109 applies predetermined image processing to the supplied image, and outputs the resultant image to a subsequent stage.

It should be noted that switching of the switch 108 is performed by a timing signal supplied from a synchronization signal generation unit 107. That is to say, the switch 108 is controlled to select the added image when a processing target is a pixel signal from a focus detection pixel, and to select the through image when a processing target is an imaging pixel. The focus detection pixel separation unit separates a pixel signal from a focus detection signal based on a timing signal supplied from the synchronization signal generation unit 107, and supplies the pixel signal to a focus detection unit 111. The focus detection unit 111 performs focus detection based on the pixel signal from the focus detection pixel supplied from the focus detection pixel separation unit 110, and controls a lens operation by outputting a control signal to a lens control unit 112.

It should be noted that each block of the imaging apparatus shown in FIG. 1 may be configured as hardware using a dedicated logic circuit and memory, except for physical devices such as the image sensor. Alternatively, each block may be configured as software, in which case an apparatus operation is controlled by a computer, such as a CPU, executing a processing program stored in a memory.

Figure 6:
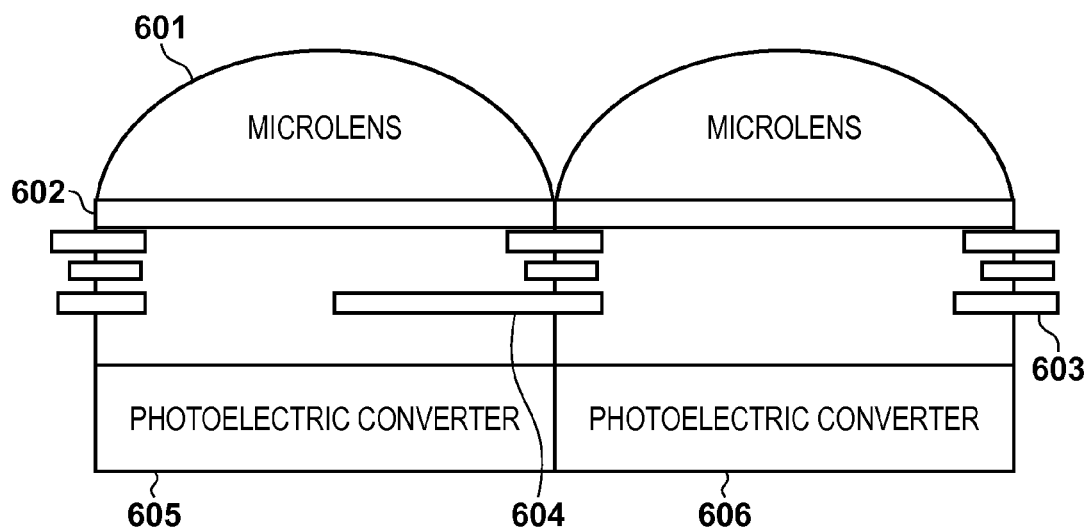
FIG. 6 is a cross-sectional view of pixels in an image sensor according to embodiments of the invention.

The following describes the configuration and operation of each block shown in FIG. 1 with reference to the attached drawings. First, the configuration and operation of the image sensor 102 according to the present embodiment will be described with reference to FIG. 6. FIG. 6 shows examples of cross-sectional configurations of an imaging pixel and a focus detection pixel in the image sensor 102 according to the embodiment. In the present embodiment, the image sensor is composed of microlenses 601, color filters 602, wiring layers 603, light blocking portions 604 formed by extending the wiring layers 603, and photoelectric converters 605 and 606 that convert incident light into an electrical signal.

The photoelectric converter 606 for an imaging pixel generates a captured image by receiving, among incident light from a microlens 601, light of a predetermined wavelength that has been transmitted through a color filter 602 and converting the received light into an electrical signal. As for the photoelectric converter 605 for a focus detection pixel, among incident light from a microlens 601, light of a predetermined wavelength that has been transmitted through a color filter 602 is partially blocked by a light blocking portion 604. Therefore, the barycentric position of an exposed surface of the photoelectric converter 605 is shifted from the central position of the corresponding focus detection pixel. The photoelectric converter 605 receives light that has not been blocked by the light blocking portion 604, and converts the received light into an electrical signal. With the above configuration, focus detection pixels that receive only a part of a pencil of light passing through the imaging lens are constructed. In a region above the photoelectric converter 605, a portion that is not blocked by the light blocking portion 604 is referred to as an open portion in the present embodiment. A pupil can be divided into two portions by preparing a pixel in which the positional relationship between the light blocking portion 604 and the open portion is reversed compared with the photoelectric converter 605. That is to say, referring to FIG. 6, in the region above the photoelectric converter 605, the open portion and the light blocking portion 604 are on the left side and the right side of the figure, respectively; in contrast, a pixel is prepared in which the open portion and the light blocking portion 604 are on the right side and the left side, respectively, in the region above the photoelectric converter 605. It should be noted that a focus detection method is not relevant to the present invention, and therefore a detailed description thereof is omitted.

Figure 7A:
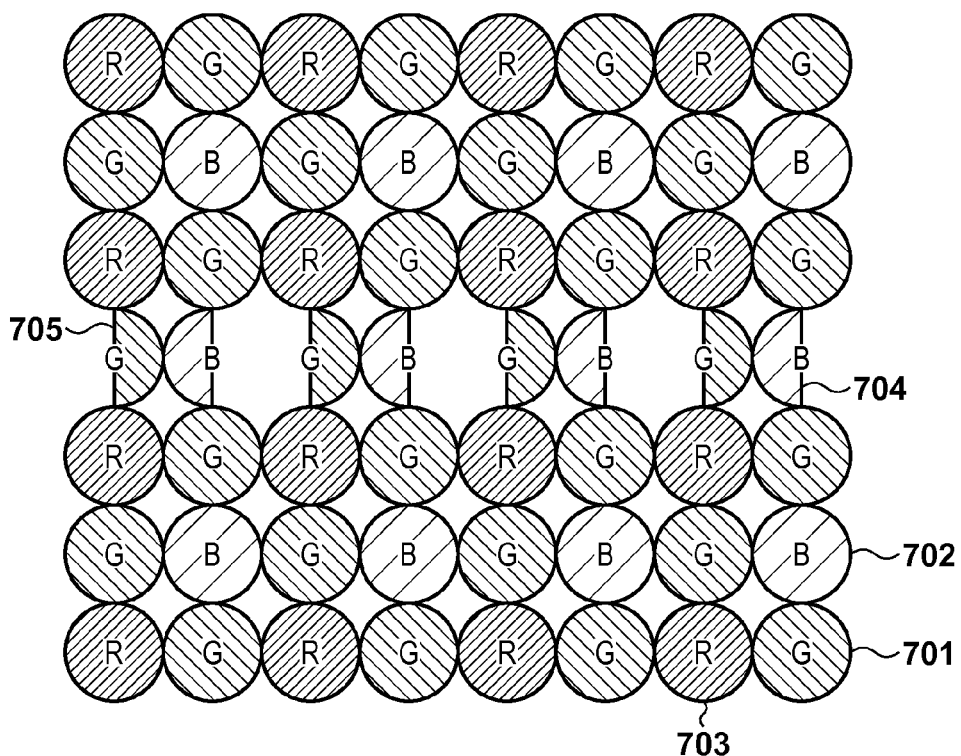
FIGS. 7A and 7B show examples of an array of pixels in the image sensor according to the embodiments of the invention.

FIG. 7A shows an array in the image sensor 102 according to the present embodiment. Pixels 701 are equipped with green color filters, pixels 702 are equipped with blue color filters, and pixels 703 are equipped with red color filters. The array shown in FIG. 7A is called the Bayer arrangement, and is used commonly in a color image sensor. Pixels 704 and 705 that are arranged among the pixels 701 to 703 are focus detection pixels. The focus detection pixels are arrayed regularly in a predetermined direction. Although the focus detection pixels are arrayed in a horizontal direction in FIG. 7A, they may be arrayed in a vertical direction or in a diagonal direction (of 45 degrees, 135 degrees, etc.). In the pixels 704, which are blue pixels, the light blocking portions and the open portions are on the right side and the left side, respectively. In the pixels 705, which are green pixels, the light blocking portions and the open portions are on the left side and the right side, respectively. Focus detection can be performed using a line including the pixels 704, 705.

In each pixel 705, the open portion is on the right side; here, a value approximating a value obtained in an open portion on the left can be obtained by applying subtraction to an average of four pixels surrounding that pixel. The focus detection unit 111 can perform focus detection by detecting a phase difference between a right-side image and a left-side image obtained from right-side and left-side pixel values thus obtained. It should be noted that a focus detection method is not the essential part of the present invention, and therefore a more detailed description thereof is omitted. As the line including the pixels 704, 705 represents the focus detection pixels, it does not include any normal imaging pixels. Accordingly, processing this line as-is leads to the occurrence of noise, and it is hence necessary to generate a signal for obtaining an image signal.

Figure 2:
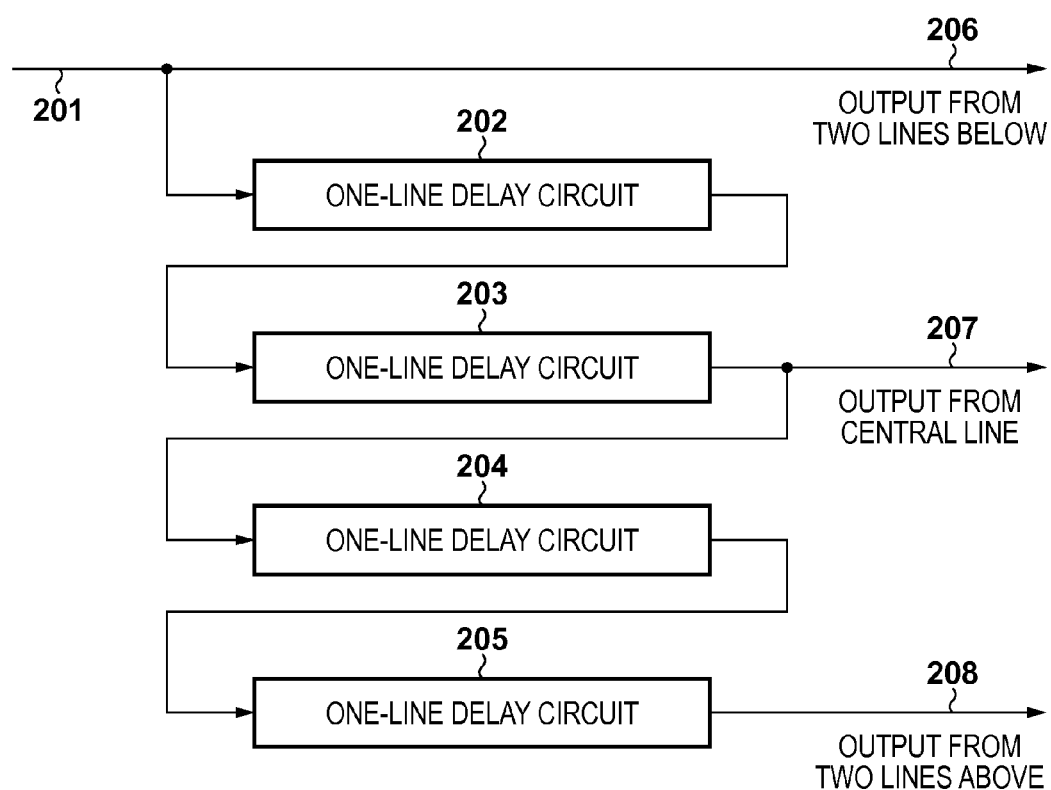
FIG. 2 is a block diagram showing an example configuration of a line memory according to the first embodiment of the invention.

The configuration and operation of the line memory 103 will now be described with reference to FIG. 2. The output from the image sensor 102 is input to the line memory 103 as an input signal 201. A one-line delay circuit 202 delays the input signal 201 by one line. The output from the one-line delay circuit 202 is input to a one-line delay circuit 203, and the one-line delay circuit 203 outputs an output signal 207 yielded by application of two-line delay to the input signal 201. The output signal from the one-line delay circuit 203 is supplied to a one-line delay circuit 205 via a one-line delay circuit 204; in this way, the output signal is delayed by one line in each of the circuits, that is to say, delayed by two lines ultimately.

There are three types of output from the line memory 103: an output signal 206 that is identical to the input signal 201, the output signal 207 output from the one-line delay circuit 203, and an output signal 208 output from the delay circuit 205. Assuming the output signal 207 as the center, pixels that are distant from the center in the up-down direction by two lines are output. Specifically, the output 208 is a pixel two lines above the center, and the output 206 is a pixel two lines below the center. Here, the up-down direction of the lines can be identified as a direction orthogonal to a direction of the array of the focus detection pixels. In this way, the central output 207 is output together with the signals 206 and 208 from two lines below and two lines above, in a synchronized manner.

The configuration and operation of the color ratio detection unit 104 will now be described with reference to FIG. 3A. The output 206 from two lines below, the central line output 207, and the output 208 from two lines above are input from the line memory 103 as the input 300, input 315, and input 321, respectively.

The color ratio detection unit 104 executes the same processing for all lines; as a signal of the input 315 is used as the output, the following describes a signal in a certain cycle corresponding to a line of that output. In a cycle where the input 315 is a green focus detection pixel, the input 300 is a green pixel two lines below (hereinafter referred to as a G pixel, or simply G), and the input 321 is a green pixel two lines above.

Figure 3A:
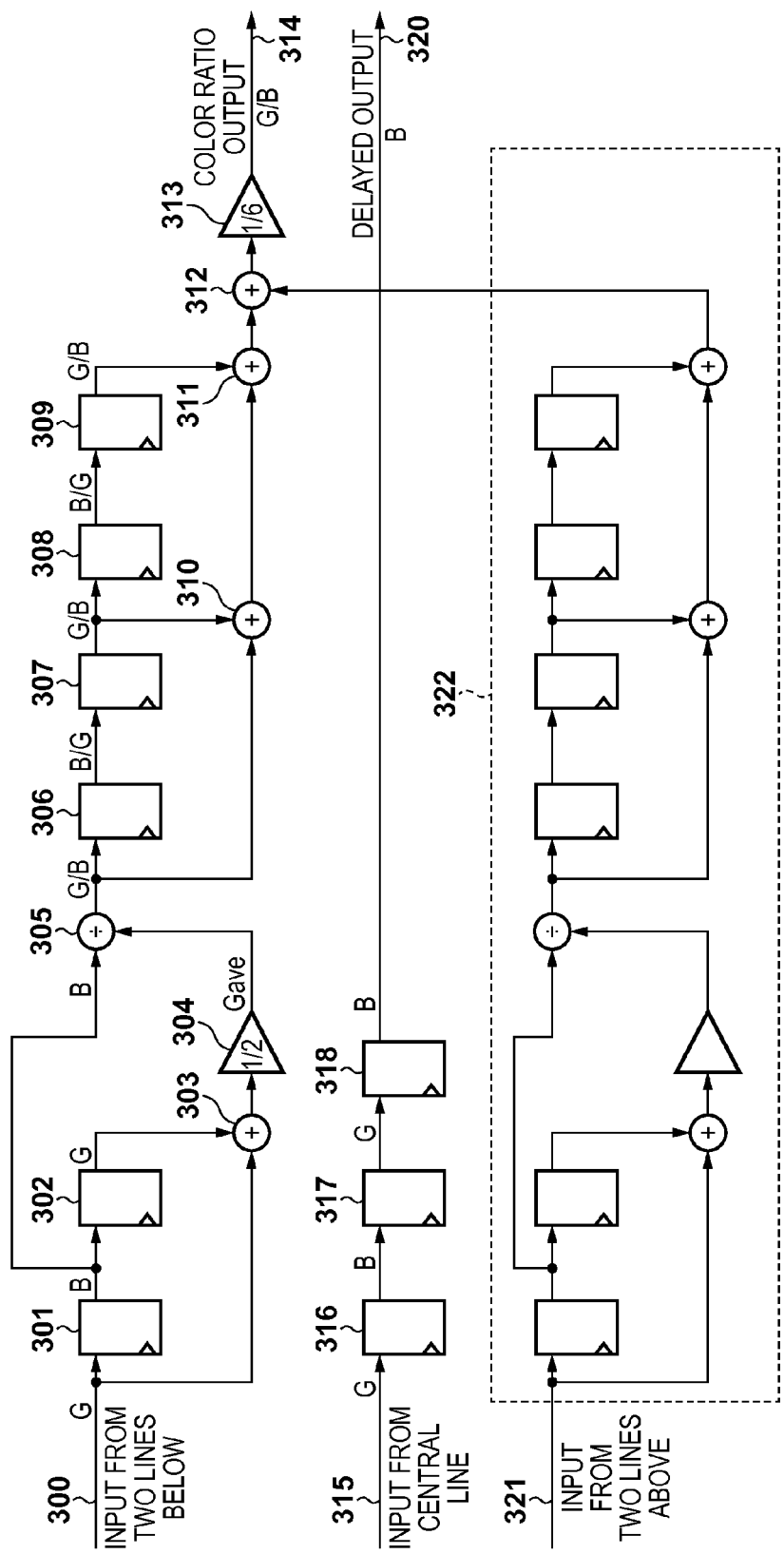
FIG. 3A shows an example configuration of a color ratio detection unit according to the first embodiment of the invention.

In FIG. 3A, the input signals are delayed using delay elements. For example, a delay element 301 outputs a blue pixel (hereinafter referred to as a B pixel, or simply B) that was input in an immediately previous cycle. An adder 303 adds a G pixel yielded from two-cycle delay applied by the delay elements 301 and 302 and the G pixel that has just been input, and an attenuator 304 produces a value that is half of the result of the addition. Furthermore, a divider 305 calculates a ratio between the output from the attenuator 304 and the output from the delay element 301. That is to say, the calculators 303, 304, 305 calculate a ratio between the pixel from the delay element 301 and an average of pixels on both neighboring sides thereof. To be specific, a color ratio is obtained after application of a low-pass filter, which is a spatial filter for limiting a frequency band, to each of an image signal composed of a G pixel and an image signal composed of a B pixel.

At this timing, the divider 305 outputs a value G/B; however, as the input 300 alternates between G and B, the output from the divider 305 similarly alternates between G/B and B/G. Delay elements 306 to 309 delay the output from the divider 305, an adder 310 adds this output and a value of two cycles later, and an adder 311 adds the result of the addition and a value of four cycles later. In this way, values that are distant in the left-right direction by two pixels are added at the timing of the output from the delay element 307.

A circuit that is the same as a circuit from the input 300 to the adder 311 is present in a block 322 indicated by a dash line. The input 321 to the block 322 is equivalent to a value from two lines above. An adder 312 adds the output from the block 322 and the output from the adder 311, an attenuator 313 attenuates the result of the addition down to ⅙, and then the result of the attenuation is output as the color ratio output 314.

Figure 3B:
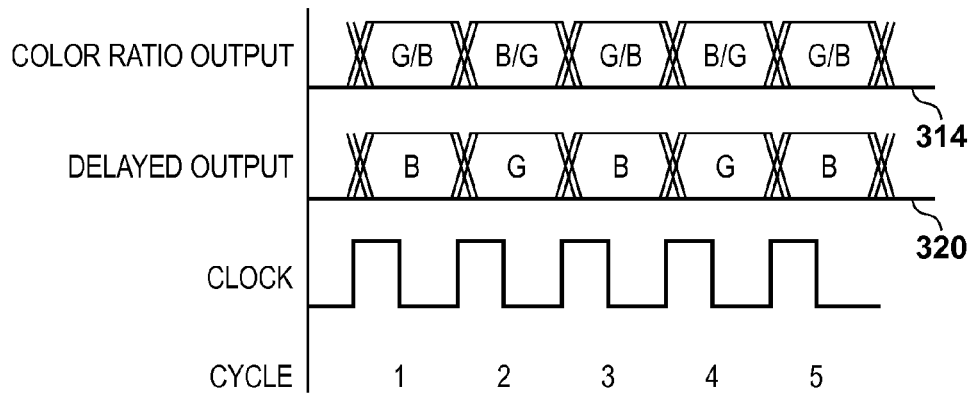
FIG. 3B shows an example operation of the color ratio detection unit according to the first embodiment of the invention.

On the other hand, delay elements 316 to 318 delay the input 315 by three cycles, and output the delay result. The number of such delay stages corresponds to the delay elements 301, 306, 307. With this circuit, an average value of color ratios in three locations from two lines above and three locations from two lines below is output together with the value of the output 320 in a synchronous manner. A timing chart of FIG. 3B shows a relationship between these outputs. As indicated by the timing chart, the delayed output 320 alternates between G and B, and the color ratio output 314 similarly alternates between G/B and B/G, throughout the cycles corresponding to a clock signal.

Figure 4A:
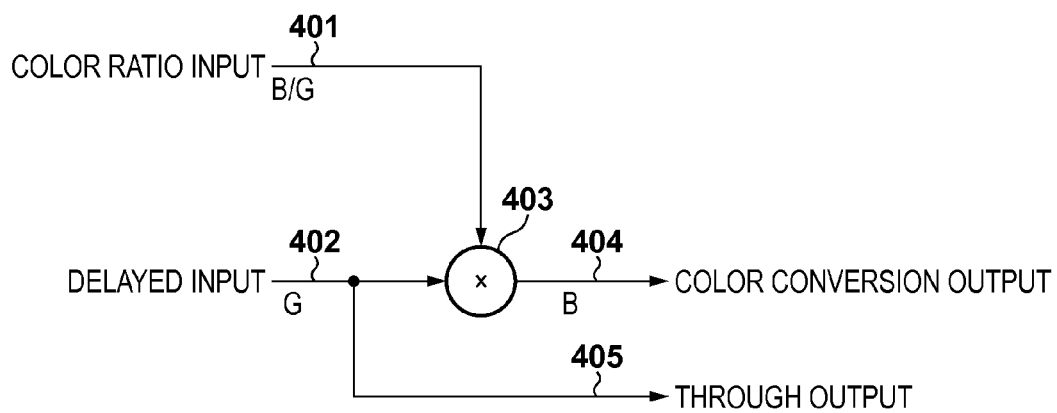
FIG. 4A shows an example configuration of a color conversion unit according to the first embodiment of the invention.

An example configuration and operation of the color conversion unit 105 will now be described with reference to FIG. 4A. The color conversion unit 105 receives the color ratio output 314 from the color ratio detection unit 104 as the input 401, and receives the delayed output 320 from the color ratio detection unit 104 as the input 402. A multiplier 403 performs color conversion by multiplying the color ratio 401 by the input 402, and outputs the color conversion output 404. The input 402 is also output as-is to a circuit in a subsequent stage as the through output 405.

In a cycle where the input 402 is a G signal, the color ratio input is B/G. Accordingly, the color conversion output 404 has a value obtained by converting the G signal into B. This output can be used as a value of B in calculation.

Figure 4B:
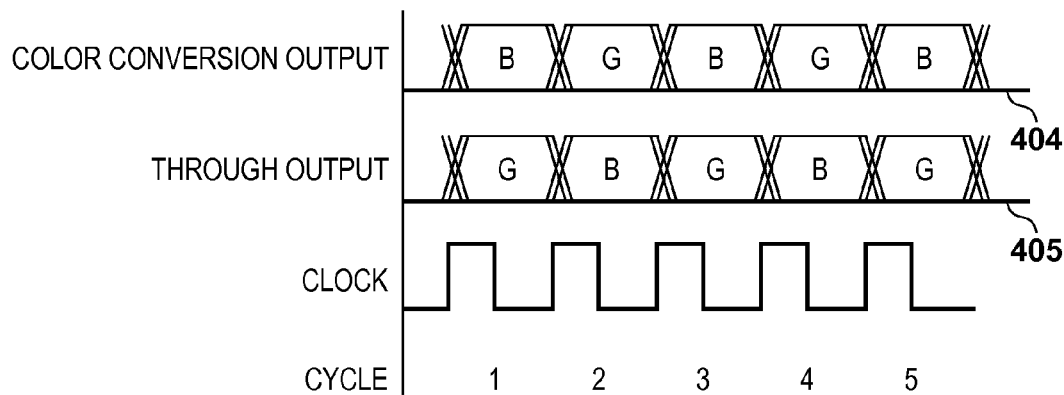
FIG. 4B shows an example operation of the color conversion unit according to the first embodiment of the invention.

A timing chart of FIG. 4B shows a relationship between these outputs. As indicated by the timing chart, the through output 405 alternates between the value G and the value B, and the color conversion output 404 is a color signal whose phase is the reverse of the phase of the through output 405, throughout the cycles corresponding to a clock.

Figure 5:
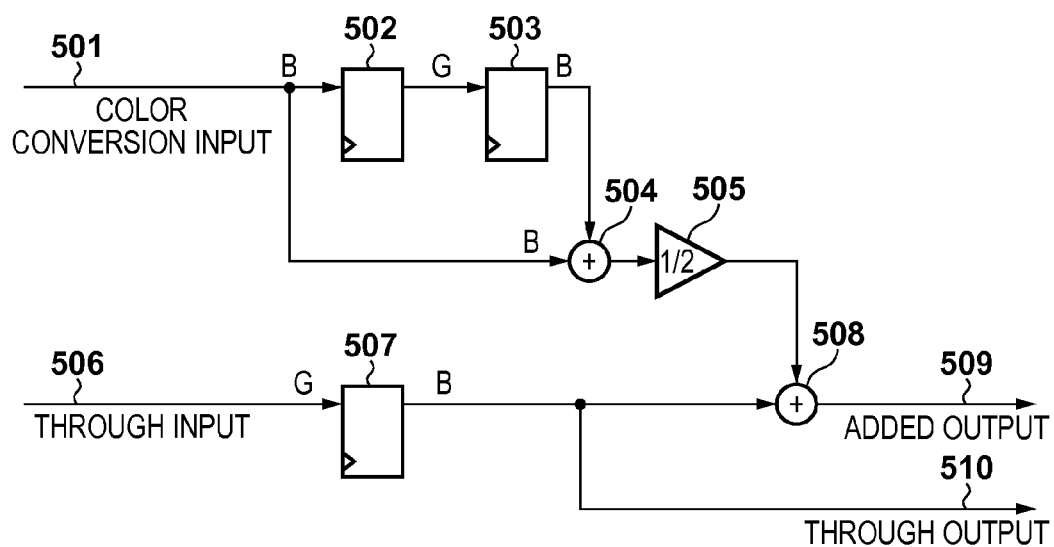
FIG. 5 is a block diagram showing an example configuration of an addition unit according to the first embodiment of the invention.

An example configuration and operation of the addition unit 106 will now be described with reference to FIG. 5. First, a value of the color conversion output 404 from the color conversion unit 105 is received as the input 501. The through output 405 from the color conversion unit 105 is received as the input 506. The input 501 is delayed by delay elements 502, 503, and supplied to an adder 504. A delay element 507 delays the input 506 by one cycle, supplies the delay result to an adder 508, and outputs the delay result as-is as the through output 510.

The adder 504 adds the input 501 and a delayed signal value yielded by application of two-cycle delay to the input 501, and outputs the result of the addition to an attenuator 505. The attenuator 505 attenuates the result of the addition by the adder 504 down to ½. The output from the attenuator 505 is supplied to the adder 508. The adder 508 adds the output from the attenuator 505 and a value yielded by application of one-cycle delay to the input 506 by the delay element 507.

For example, in a cycle where the input 506 is G, the delay element 507 outputs B, and the input 501 and the output from the delay element 503 are also B. With this circuit, assuming the output B from the delay element 507 as the center, an average of values obtained by converting pixels on the left and right of the center into B is added.

The added output 509 and the through output 510 are input to the switch 108. The synchronization signal generation unit 107 outputs a switch signal for switching the switch 108; the through output 510 is selected and output at a timing for outputting a normal imaging pixel, whereas the added output 509 is selected and output at a timing for outputting a focus detection pixel.

In this way, the switch 108 always outputs a signal compliant with to the Bayer arrangement, and therefore the signal processing unit 109 can generated a video signal through normal Bayer processing. The above-described circuit configuration makes it possible to generate a signal that covers an entire region of a pencil of light passing through the imaging lens using neighboring pixels, which do not have the same color, with respect to the output from the image sensor including the focus detection pixels arrayed as shown in FIG. 7A.

In the present embodiment, a color ratio of imaging pixels surrounding a focus detection pixel is detected, a color conversion value for interpolating a pixel value output from the focus detection pixel is generated based on the color ratio, and the color conversion value is added with the pixel value; as a result, reproducibility of high-frequency components in the position of the focus detection pixel can be improved.

Second Embodiment

Figure 7B:
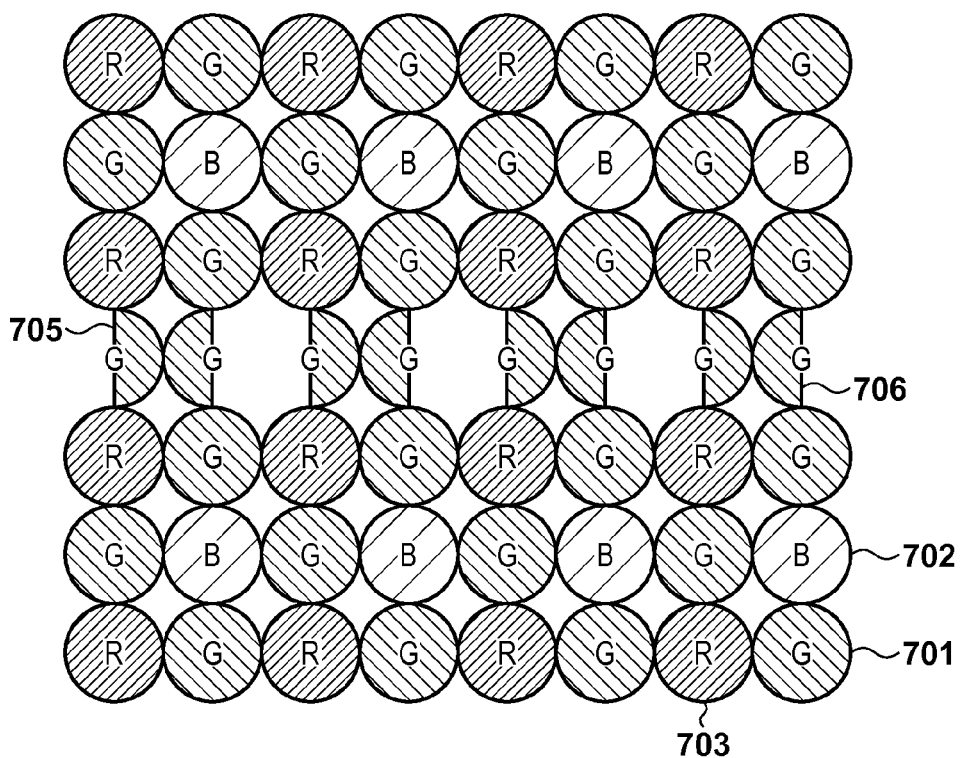

The following describes a second embodiment of the invention. FIG. 7B shows an array in an image sensor according to the present embodiment. Pixels 701 to 703 and 705 are similar to their counterparts in the first embodiment. Pixels 706 are G pixels in which light blocking regions and open regions are reversed compared with the pixels 705. That is to say, as opposed to the first embodiment in which G focus detection pixels and B focus detection pixels are alternately arrayed as shown in FIG. 7A, all of the focus detection pixels are G in the present embodiment. With such an array, focus detection can be performed by generating a left image and a right image and detecting a phase difference for each of the pixels 705, 706. It should be noted that focus detection is not the essential part of the present invention, and therefore a detailed description thereof is omitted.

Figure 8:
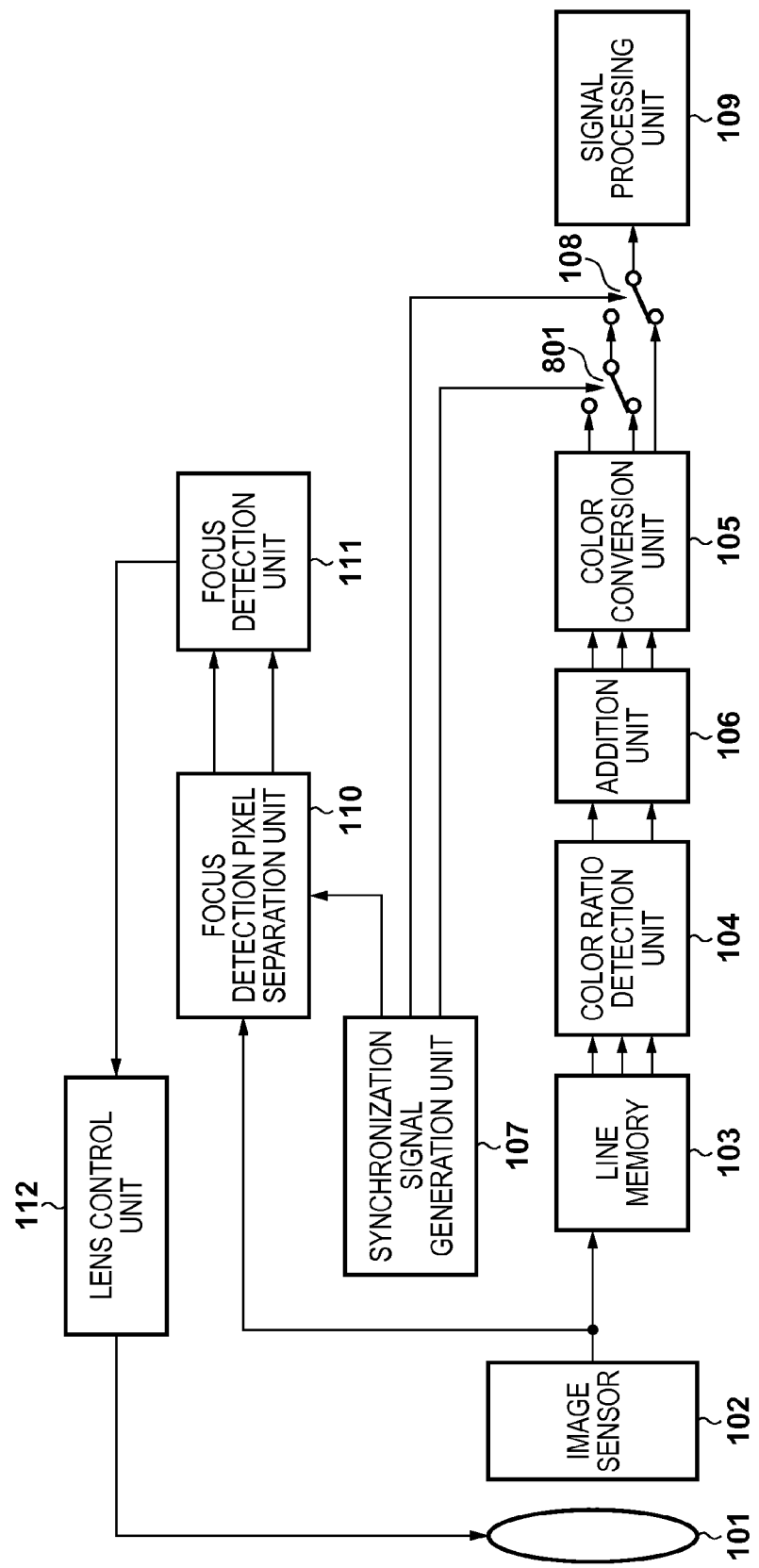
FIG. 8 is a block diagram showing an example configuration of an imaging apparatus according to a second embodiment of the invention.

FIG. 8 is a block diagram showing an example configuration of an imaging apparatus according to the present embodiment. Compared with the configuration of the first embodiment, an addition unit 106 and a color conversion unit 105 are reversed in order. In the second embodiment, all of the focus detection pixels are G, that is to say, neighboring pixels have the same color; therefore, addition can be performed by interpolating a light blocking region using pixels on the left and right. Furthermore, in addition to a switch 108 for switching between a focus detection pixel and a normal imaging pixel, the present embodiment includes a switch 801 for switching between the output from the color conversion unit 105 and the added output.

The configuration and operation of the addition unit 106 according to the present embodiment will now be described with reference to FIG. 9. The delayed output 320 from a color ratio detection unit 104 shown in FIG. 3B is received as the input 901. All of the input signals are G; after delay elements 902, 903 have delayed the input 901, an adder 904 adds the original input 901 and the output from the delay element 903, and an attenuator 905 attenuates the result of the addition down to ½. The output from the attenuator 905 is input to an adder 906 and added to the output from the delay element 902; as a result, the added output 907 is generated. With this circuit, assuming the output G from the delay element 902 as the center, the added output is obtained by adding an average of values of pixels on the left and right of the center. The output from the delay element 902 is also output as-is as the through output 908 without being added by the adder 906.

Furthermore, a delay element 912 receives the color ratio output 314 from the color ratio detection unit 104 as the input 911, delays the same by one cycle, and outputs the delay result as the color ratio output 913.

Figure 9:
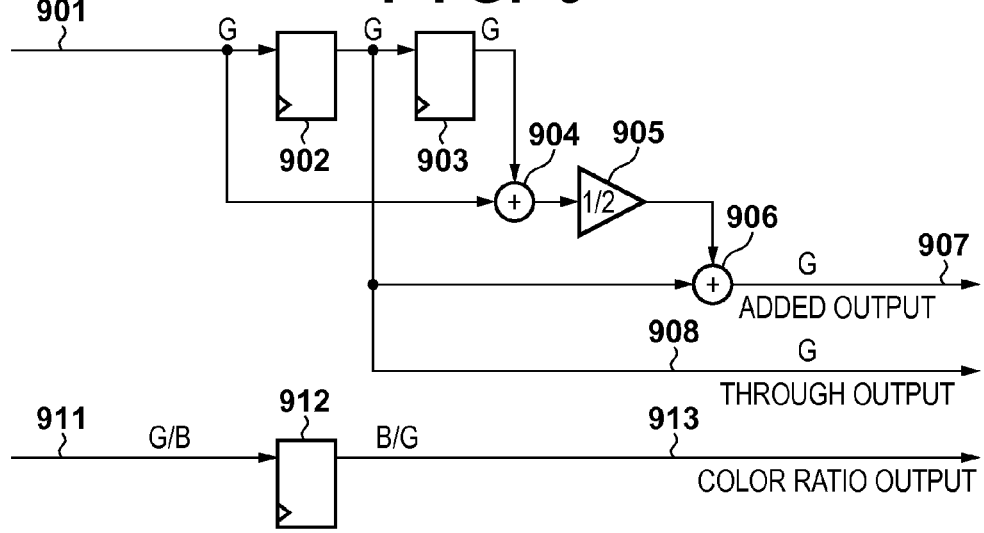
FIG. 9 is a block diagram showing an example configuration of an addition unit according to the second embodiment of the invention.

As indicated above, in FIG. 9, every input 901 has the same color, i.e., G; this configuration is different from the configuration of the first embodiment in that the output from the delay element 902 serves as the central pixel.

Figure 10A:
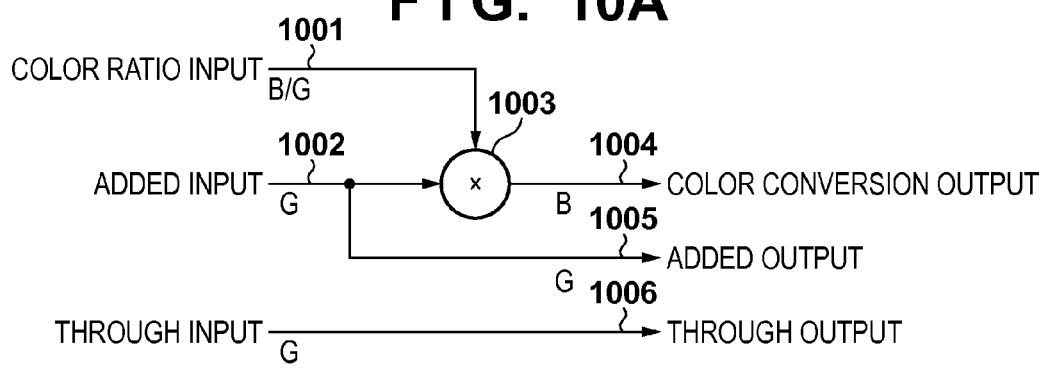
FIG. 10A shows an example configuration of a color conversion unit according to the second embodiment of the invention.

The configuration and operation of the color conversion unit 105 according to the second embodiment will now be described with reference to FIG. 10A. First, the color ratio output 913 from the addition unit 106 is received as the input 1001. Also, the added output 907 from the addition unit 106 is received as the input 1002. A multiplier 1003 applies color conversion to the added input 1002 by adding the added input 1002 with the input 1001, and outputs the color conversion output 1004. It should be noted that the color conversion yields a valid value when the color ratio input is B/G and the added input is G. In this way, a B pixel, which is not included among the focus detection pixels, can be generated.

On the other hand, when the color ratio input is G/B and the added input is G, the color ratio cannot be calculated, and hence an invalid value is yielded. However, this case corresponds to a timing for G, and does not pose any problem as it is just sufficient to use an added pixel value obtained by the addition unit 106. Accordingly, the added input 1002 is also output as-is as the added output 1005, and the through output 908 from the addition unit 106 is output as-is as the through output 1006.

The outputs from the color conversion unit 105 are supplied to the switches 801 and 108. The through output 1006 is input to the switch 108, whereas the color conversion output 1004 and the added output 1005 are input to the switch 801. It should be noted that an output signal from the switch 801 is also input to the switch 108.

Figure 10B:
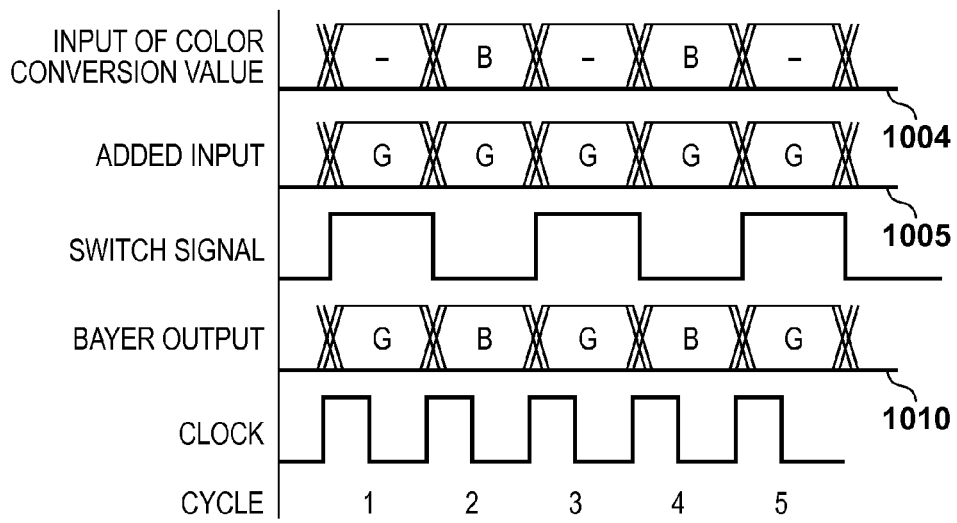
FIG. 10B shows an example operation of the color conversion unit according to the second embodiment of the invention.

FIG. 10B is a timing chart showing input/output signals related to the switch 801. The color conversion output 1004 and the added output 1005 from the color conversion unit 105 are input to the switch 801. The added output 1005 is always G, and the color conversion output 1004 switches to one of a valid value and an invalid value, which alternate, on a per-cycle basis. The valid value is B. The added output 1005 and the color conversion output 1004 are selected when the switch signal supplied from the synchronization signal generation unit 107 is high and low, respectively. In this way, the switch signal is effective only in a cycle where the color conversion has appropriately yielded the valid value, i.e., B. Accordingly, the output from the switch 801 alternates between G and B in harmony with the Bayer output 1010. As indicated above, the output from an image sensor in which one line of focus detection pixels is included and all of the focus detection pixels are G can also be converted into a signal that is equivalent to a signal of the Bayer arrangement.

In the present embodiment, a color ratio of imaging pixels surrounding a focus detection pixel is detected, and a signal of a blue pixel can be generated in the position of the focus detection pixel based on the color ratio, even though no blue pixel is included among focus detection pixels. Furthermore, as this signal is generated using the color ratio, reproducibility of high-frequency components in the position of the focus detection pixel can be improved.

Third Embodiment

Figure 11:
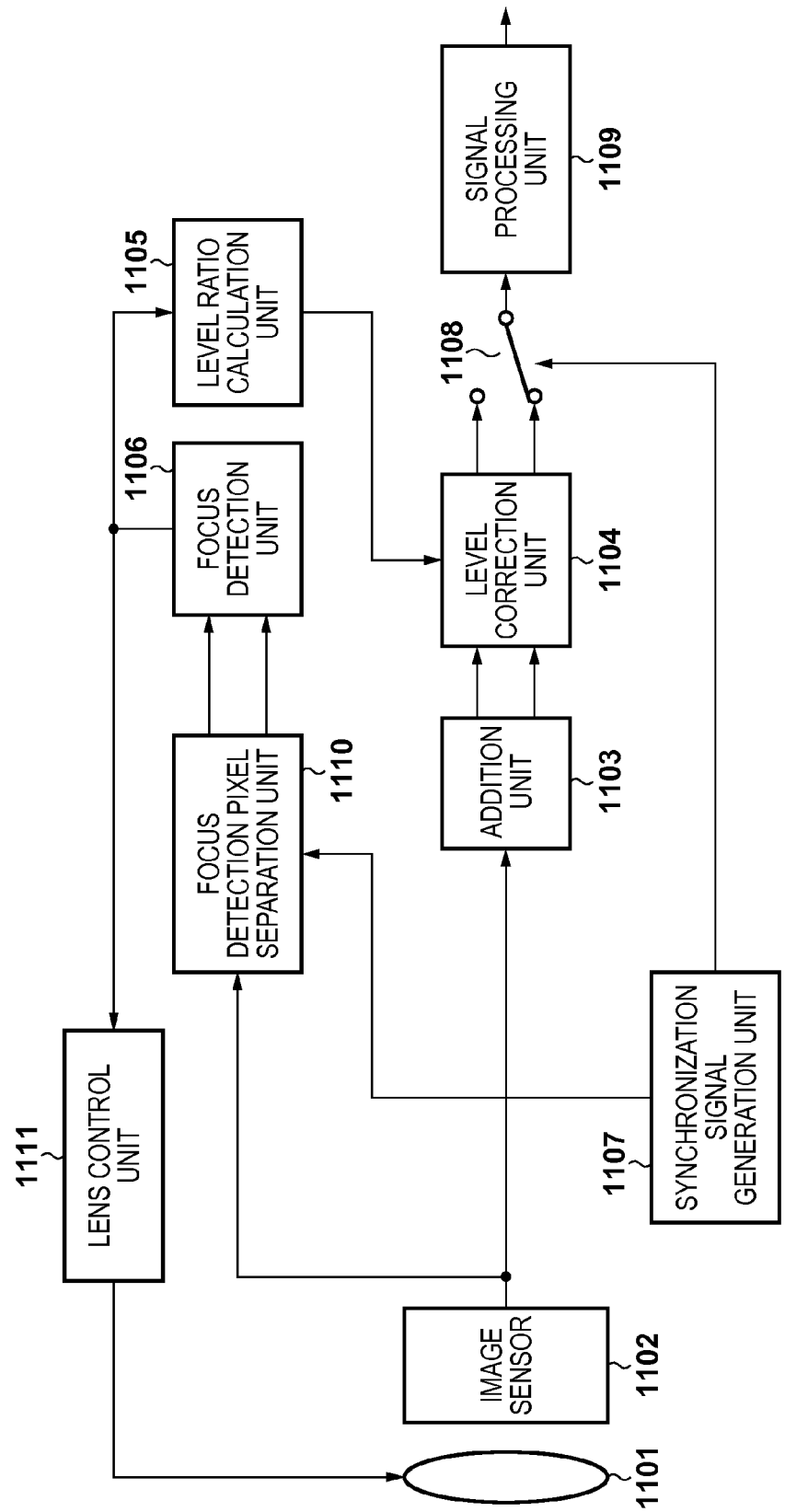
FIG. 11 is a block diagram showing an example configuration of an imaging apparatus according to a third embodiment of the invention.

The following describes a third embodiment of the invention. FIG. 11 is a block diagram showing an example configuration of an imaging apparatus according to a third embodiment of the invention. The imaging apparatus is constituted by an imaging lens 1101 and an image sensor 1102. The imaging apparatus includes an addition unit 1103, a level correction unit 1104, a level ratio calculation unit 1105, a focus detection unit 1106, a synchronization signal generation unit 1107 that generates a timing signal for signal processing, a switch 1108, a signal processing unit 1109 that generates a video signal, a focus detection pixel separation unit 1110, and a lens control unit 1111 that drives the lens in accordance with the output from the focus detection unit.

The image sensor 1102 outputs a signal compliant with the array shown in FIG. 7A. Although pixels are colored by corresponding color filters in FIG. 7A, the image sensor may include black and white pixels equipped with transparent filters in place of the color filters. The synchronization signal generation unit 1107 generates a timing signal so that the focus detection pixel separation unit 1110 can separate focus detection pixels in a line including the array of focus detection pixels 704, 705 shown in FIG. 7A. The focus detection unit 1106 performs focus detection based on a focus detection pixel signal transferred from the focus detection pixel separation unit 1110, and outputs a control signal to the lens control unit 1111. The focus detection unit 1106 is not the essential part of the present invention, and therefore a detailed description thereof is omitted.

The output from the image sensor 1102 is also transferred to the addition unit 1103 and the level correction unit 1104. The addition unit 1103 and the level correction unit 1104 can both perform through output, that is to say, output a signal without processing the signal. Based on the timing signal from the synchronization signal generation unit 1107, a signal switch circuit 1108 switches between the through output of a pixel value used in adding and the output of a corrected pixel value processed by the addition unit 1103 and the level correction unit 1104. In this way, it switches to the through output in a line including imaging pixels, and to the output of a corrected pixel value yielded from adding and level correction in a line where focus detection pixels are arranged, and each output is transferred to the signal processing unit 1109.

The following describes processing executed by the addition unit 1103 and the level correction unit 1104 in order to convert a signal of a focus detection pixel into a signal that is processed similarly to an imaging pixel.

Figure 12:
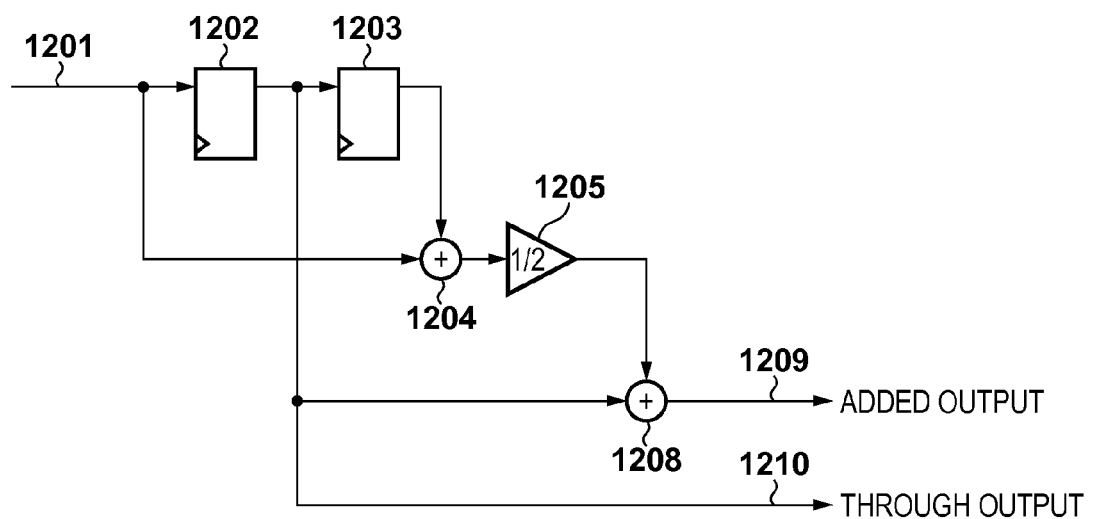
FIG. 12 is a block diagram showing an example configuration of an addition unit according to the third embodiment of the invention.

First, the configuration and operation of the addition unit 1103 will be described with reference to FIG. 12. A pixel signal output from the image sensor 1102 is received as the input 1201, and delayed by delay elements 1202, 1203. Assuming a signal from the delay element 1202 as a central pixel, a signal of the input 1201 and a signal from the delay element 1203 are equivalent to a signal of a pixel on the left and a signal of a pixel on the right, respectively. For example, in a case where the signal from the delay element 1202 is a focus detection pixel 705 that is open on the right side, the signal of the input 1201 and the signal from the delay element 1203 have values of focus detection pixels 704 that are open on the left side. An adder 1204 adds the values of the pixels arranged on the left and right of the central pixel, i.e., the pixels 704 that are open on the left side, and an attenuator 1205 attenuates the result of the addition down to ½. The output from the attenuator 1205 is supplied to an adder 1208 and added to the output from the delay element 1202; as a result, the added output 1209 is obtained. In the next cycle, the delay element 1202 outputs a focus detection pixel 704 that is open on the left side, and this output is similarly added with pixels that are on the left and right thereof, i.e., focus detection pixels 705 that are open on the right side.

In this processing executed by the addition unit 1103, addition is performed by interpolating the central half-open pixel using pixels that are on the left and right thereof, i.e., pixels that have the same barycenter and are open on the other side; this processing is described in Japanese Patent Laid-Open No. 2010-243772. Through this interpolation processing, a pixel having characteristics that are similar to the characteristics of an imaging pixel can be output. However, even if the interpolation is performed using pixels in which light blocking portions are reversed, there will be a level difference compared with surrounding pixels due to a difference between shading characteristics of added pixels and shading characteristics of imaging pixels; this gives rise to the possibility that a light trace of focus detection pixels undesirably remains in an image.

Figure 13A:
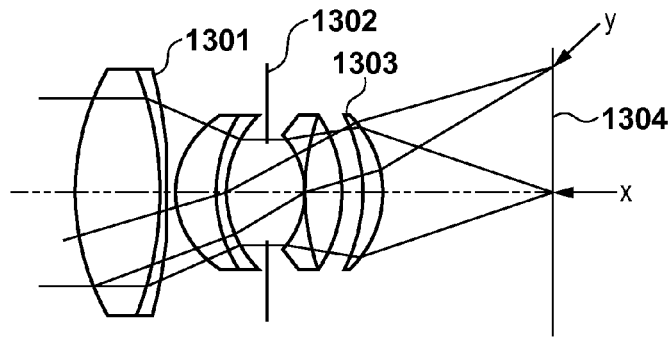
FIGS. 13A, 13B, and 13C are diagrams for describing shading.
Figure 13B:
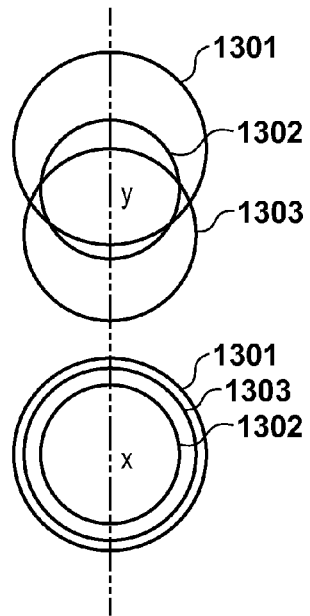

The reason why shading occurs will now be described with reference to FIG. 13A showing a cross-sectional view of the lens. The lens 1101 shown in FIG. 11 can be constituted by an anterior lens 1301, a diaphragm 1302, and a posterior lens 1303, and a subject image is formed by collecting reflected light from an object with the lenses and focusing the reflected light onto an image sensing surface 1304. A frame of the anterior lens 1301 is called an anterior frame, whereas a frame of the posterior lens 1303 is called a posterior frame. FIG. 13B shows how the frames of 1301, 1302, and 1303 overlap when viewed from the position x on the image sensing surface 1304, and how the frames of 1301, 1302, and 1303 overlap when viewed from the position of y on the same image sensing surface. When viewed from the position x, a light amount is limited only by the diaphragm 1302; however, when viewed from the position y, a light amount is limited not only by the diaphragm 1302, but also by the anterior frame 1301 and the posterior frame 1303.

Figure 13C:
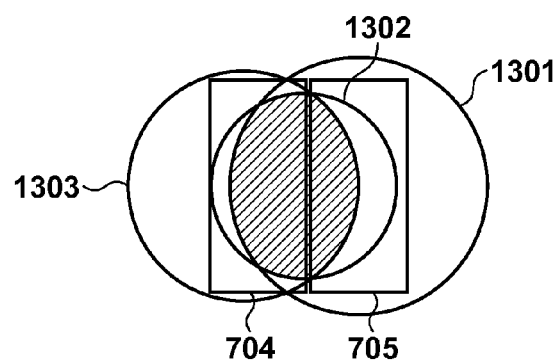

FIG. 13C shows a state in which focus detection pixels in the image sensor 1102 are placed so as to overlap a range that is reached by light (a portion with hatching) in the position y shown in FIG. 13B. It is apparent that a range reached by light significantly differs between the pixels 704 and 705. Shading is a phenomenon in which a light amount (an amount of light received by a pixel) decreases as a distance from the center of an optical axis increases and an image height increases, and the property of shading is such that an increased image height leads to loss of balance in an image produced with a divided pupil. The shape of the portion with hatching in FIG. 13C is called a vignetting shape. The vignetting shape varies depending on locations, and changes little by little as its location changes.

Figure 14:
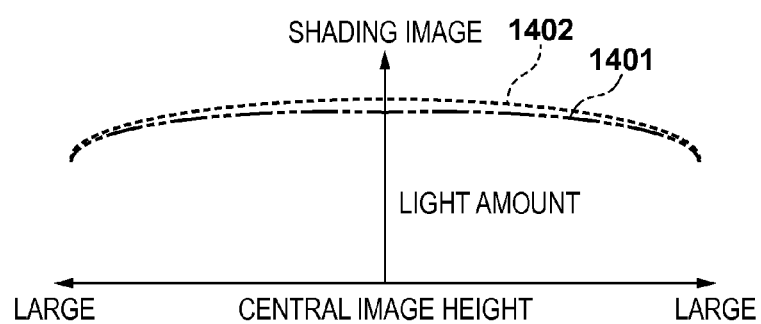
FIG. 14 is a diagram for describing shading images.

FIG. 14 shows shading images in lines passing through a certain image height center. A horizontal axis represents a position on the image sensor 1102, and a vertical axis represents a light amount. A dash line 1402 indicates a shading image of imaging pixels (701 to 703), and a line 1401 with alternating two dots and one dash indicates a shading image of the added output from focus detection pixels (704, 705). It is apparent that the shading images 1401 and 1402 have different characteristics. The light amount decreases as a distance from the image height center increases; the shading image 1402 has a higher light amount than the shading image 1401 at the image height center, but has a lower light amount than the shading image 1401 at a large image height as their relative relationship is reversed in terms of the light amount.

In view of this, in the present embodiment, the difference between the characteristics of the shading image 1401 and the characteristics of the shading image 1402 is absorbed using the level correction unit 1104. The following describes the reason why there is a difference between the shading image of the added output from focus detection pixels and the shading image of the output from imaging pixels with reference to FIGS. 15A and 15B.

Figure 15A:
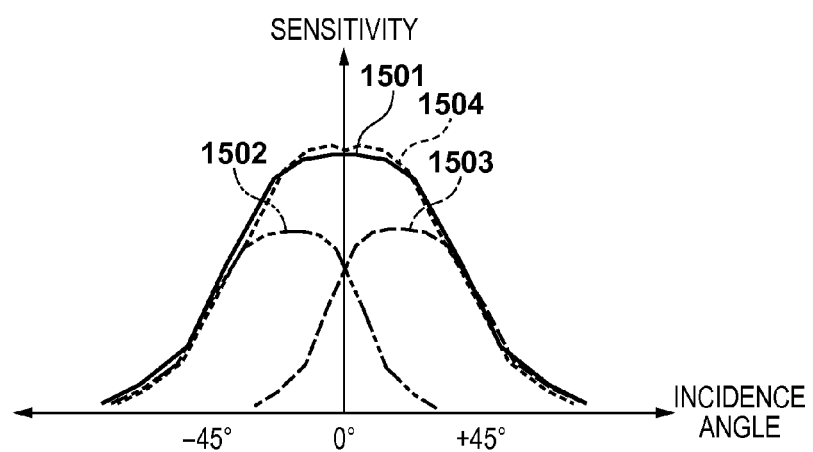
FIGS. 15A and 15B are diagrams for describing a difference between a shading image of imaging pixels and a shading image of focus detection pixels.

FIG. 15A is a graph showing pupil intensities of imaging pixels and focus detection pixels. A horizontal axis represents an incidence angle of incident light, and a vertical axis represents sensitivity. The imaging pixels 701 and the like have the characteristics 1501. Assuming that a perpendicular incidence angle is 0°, the highest sensitivity is achieved at 0°, and the sensitivity decreases as the incidence angle deviates therefrom. As opposed to the imaging pixels having the characteristics 1501, focus detection pixels 704 have the characteristics 1502. As the focus detection pixels 704 are open on the left side, they have the highest sensitivity at an angle corresponding to the center of their open portions. Similarly, focus detection pixels 705, which are open on the right side, have the characteristics 1503. In this way, pupil division is realized by separation of the center of sensitivity to left and right.

The characteristics 1504 are obtained by adding the characteristics 1502 and the characteristics 1503. The characteristics 1504 match the characteristics of the output from the addition unit related to the focus detection pixels. Essentially, the characteristics obtained by adding the characteristics 1502 and the characteristics 1503 are designed to match the characteristics 1501; however, even with the addition of the characteristics obtained by shielding light with aluminum wiring layers, it is difficult to achieve exactly the same characteristics as pixels for which light is not blocked, and hence there is a slight difference in characteristics. Although the horizontal axis in FIG. 15A only represents the characteristics in the X direction, in reality such characteristics are represented on a plane defined by the X axis and the Y axis, and referred to as a pupil intensity distribution.

Figure 15B:
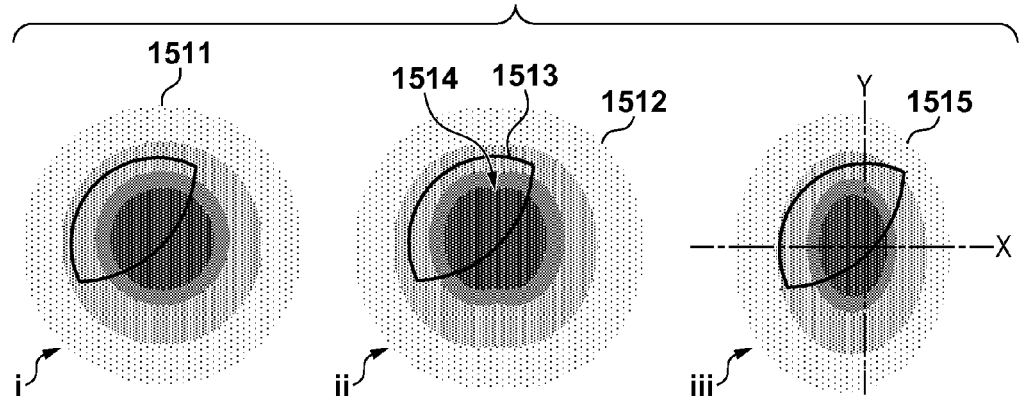

FIG. 15B shows pupil intensity distributions represented by contour lines. Referring to FIG. 15B, 1511 in (i) indicates the pupil intensity distribution of the imaging pixels 701 and the like. In (ii), 1512 indicates the pupil intensity distribution of an added signal yielded from focus detection pixels. A difference from the imaging pixels is indicated by 1514 around a central portion of the intensities. A vignetting shape is indicated by 1513. In (iii), 1515 indicates the pupil intensity distribution of the focus detection pixels 704. A difference between light amounts at a certain image height matches a difference between integrated values of pupil intensities inside the vignetting shape 1513. Therefore, an integrated value obtained in the case of (i) differs from an integrated value obtained in the case of (ii). This is why there is a difference between the shading images 1401 and 1402 shown in FIG. 14. As such characteristics depend on the vignetting shape, they change in accordance with a zoom position and a focusing position of the lens, the status of the diaphragm, and the like.

In order to correct a difference between such characteristics, the level correction unit 1104 according to the present embodiment applies a gain to an added pixel value output from the addition unit 1103. Specifically, the added pixel value is corrected based on a correction amount supplied from the level ratio calculation unit 1105, so as to eliminate the difference between the shading images shown in FIG. 14. At this time, the correction amount decreases as a distance from the image height center increases. It should be noted that the level ratio calculation unit 1105 receives, as input, the control signal transmitted from the focus detection unit 1106 to the lens control unit 1111, obtains information related to settings during imaging, such as the zoom position and the focusing position of the lens and the diaphragm, and determines the correction amount.

Figure 16A:
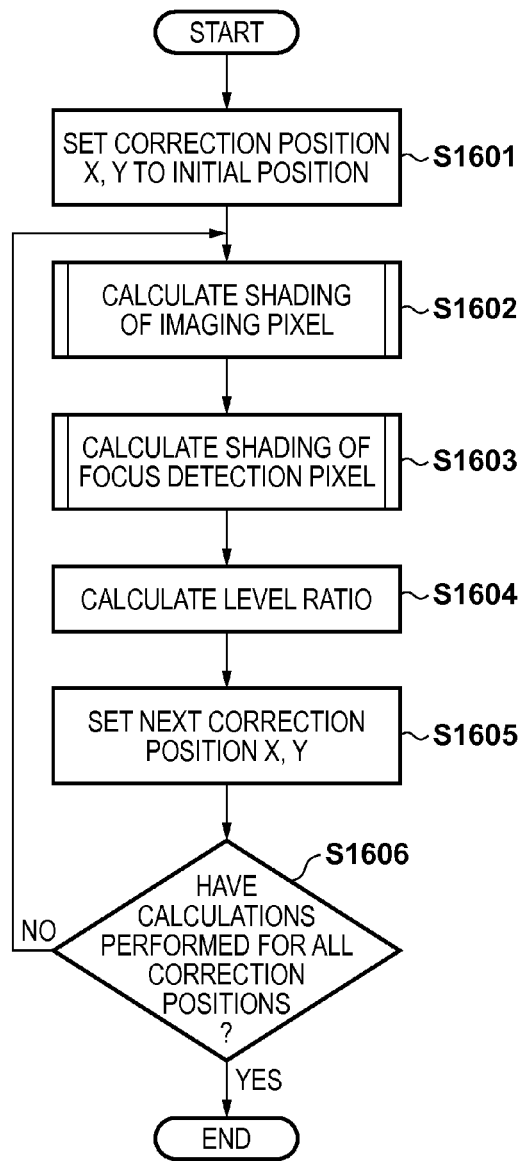
FIGS. 16A to 16C are flowcharts showing an example of processing executed by a level ratio calculation unit according to the third embodiment of the invention.
Figure 16B:
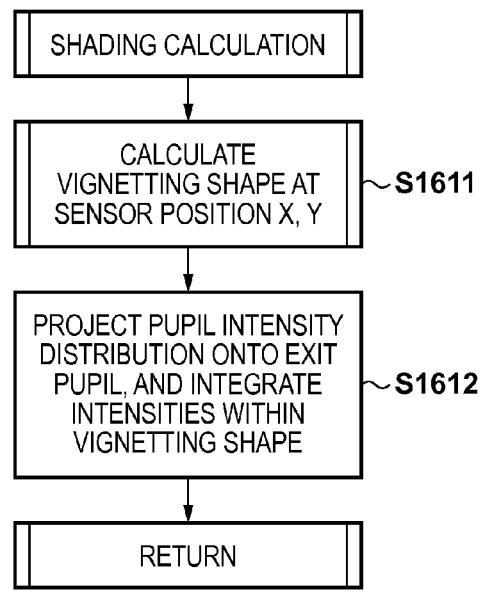
Figure 16C:
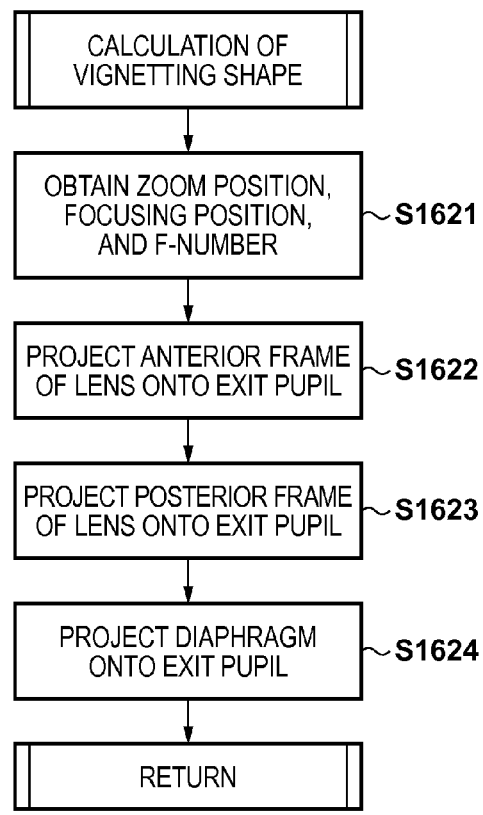

FIGS. 16A to 16C are flowcharts showing an example of processing executed by the level ratio calculation unit 1105. The processing corresponding to this flowchart can be realized by, for example, a CPU functioning as the level ratio calculation unit 1105 executing a corresponding program (stored in a ROM and the like).

First, in step S1601, the position of a focus detection pixel to be corrected is set to an initial value. In a subsequent loop from step S1602 to step S1606, all of the positions of focus detection pixels are covered. First, in step S1602, the shading characteristics of imaging pixels are calculated. Next, in step S1603, the shading characteristics of an added focus detection pixel are calculated. Furthermore, the ratio between shading of the imaging pixels and shading of the added focus detection pixel is calculated in step S1604, and the next correction position is set in step S1605. In step S1606, whether the calculations have been completed for all of the correction positions is determined, and if the calculations have been completed, processing is ended. If the calculations have not been completed, processing returns to step S1602 to be continued.

The shading calculations in steps S1602 and S1603 are performed through a shading calculation routine shown in FIG. 16B. It should be noted that steps S1602 and S1603 use different pupil intensity distributions as parameters to be applied to the shading calculations.

In the shading calculation processing, first, a vignetting shape viewed from a position X, Y is calculated for each pixel in the image sensor 1102 and projected onto an exit pupil in step S1611. Next, in step S1612, the pupil intensity distribution is projected onto the exit pupil, and the intensities within the vignetting shapes are integrated. Consequently, a value corresponding to an integrated value of the intensities within the vignetting shape 1513 shown in FIG. 15B is calculated. Thereafter, processing returns to the parent routine. It should be noted that projection onto the exit pupil is realized by executing processing for projecting various graphics onto a plane of a distance corresponding to the diaphragm based on the distance and diameter of a lens frame. Therefore, if the zoom position, the focusing position, and an f-number change, the distance and diameter of the frame change, and re-calculation is required.

The vignetting shape calculation in step S1611 can be performed in accordance with a subroutine shown in FIG. 16C. First, the zoom position, the focusing position, and the f-number are obtained in step S1621, and the anterior frame of the lens is projected onto the exit pupil in step S1622. Next, the posterior frame of the lens is projected onto the exit pupil in step S1623, and the diaphragm is projected onto the exit pupil in step S1623; the vignetting shape is represented by the inside of all projected graphics. Thereafter, processing returns to the parent routine.

In the above-described manner, the level of an added pixel value is corrected based on the shading characteristics, and the level difference between imaging pixels and focus detection pixels can be eliminated; accordingly, the problem of a light trace of focus detection pixels remaining in an image can be resolved.

Fourth Embodiment

The following describes a fourth embodiment of the invention. In the above-described third embodiment, the level ratio calculation unit 1105 obtains a vignetting shape by performing geometric calculations based on the lens status, and obtains a gain that is ultimately applied to an added focus detection pixel by calculating a shading coefficient from the pupil intensity distribution and the vignetting shape. In contrast, in the present embodiment, a level ratio calculation unit 1105 calculates a gain using a pre-calculated table.

Figure 17A:
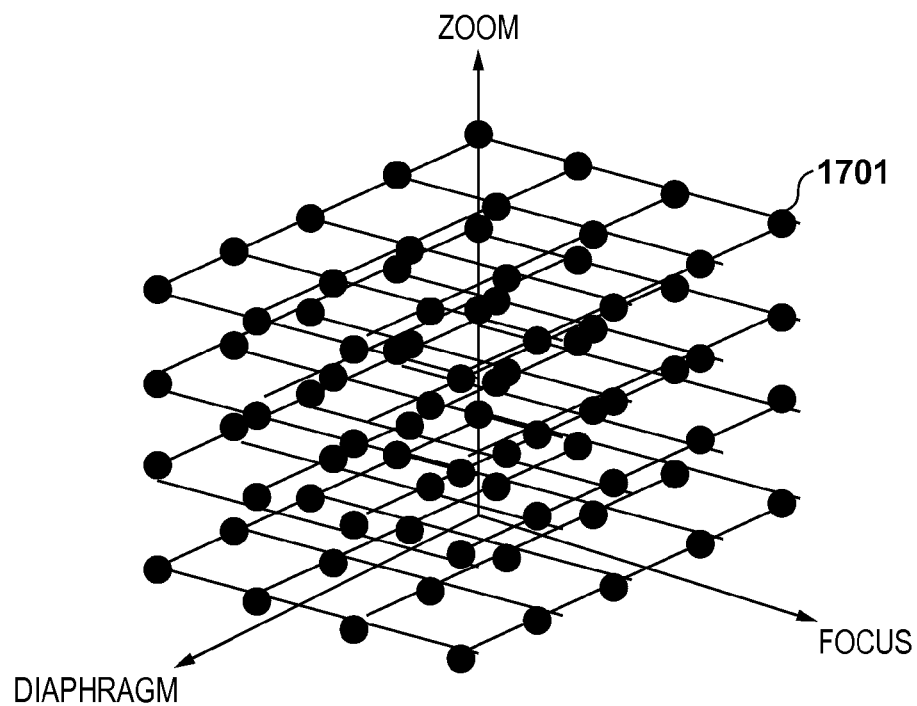
FIGS. 17A and 17B show an example of a gain table and correction amounts according to a fourth embodiment of the invention.

FIG. 17A shows a gain table for registering correction amounts at certain positions X, Y in an image sensor 1102. A vertical axis, a horizontal axis, and a depth direction represent a diaphragm, a focus position, and a zoom position, respectively, and one piece of data indicating a correction amount is represented by an intersection of scale marks discretely plotted along the axes. One piece of data is represented by a position of a black point 1701. With the use of this gain table, once the zoom, focus, and diaphragm have been determined, a correction amount is uniquely determined. It should be noted that, as the correction amounts registered with the table are discrete values, if there is no value corresponding to the zoom, focus, and diaphragm, a correction amount can be obtained by performing interpolation using a nearby value.

Figure 17B:
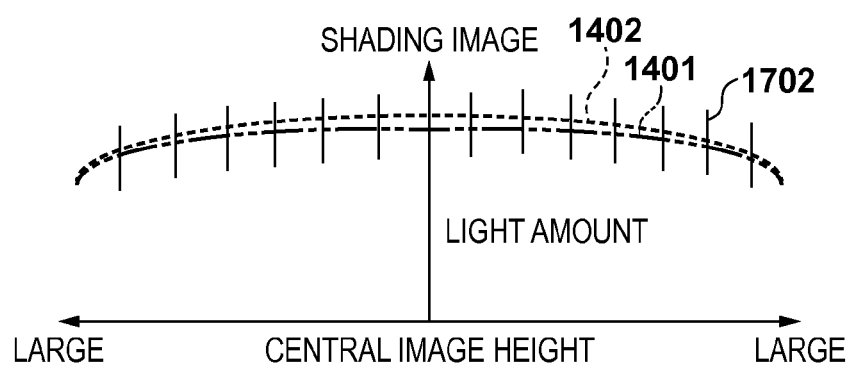

FIG. 17B shows shading images together with scale marks 1702 that are discretely plotted in a direction of a horizontal axis. The table shown in FIG. 17A is prepared for each one of the positions of these scale marks. A gain corresponding to an intermediate position between the scale marks shown in FIG. 17B can be obtained by performing interpolation using nearby data.

As indicated above, the level ratio calculation unit 1105 according to the present embodiment can obtain a gain with reference to pre-calculated data. Other than the level ratio calculation unit 1105, the present embodiment is similar to the third embodiment.

Fifth Embodiment

The following describes a fifth embodiment of the invention. In the present embodiment, a level ratio calculation unit 1105 detects a level ratio without using design information and control information of a lens.

Figure 18A:
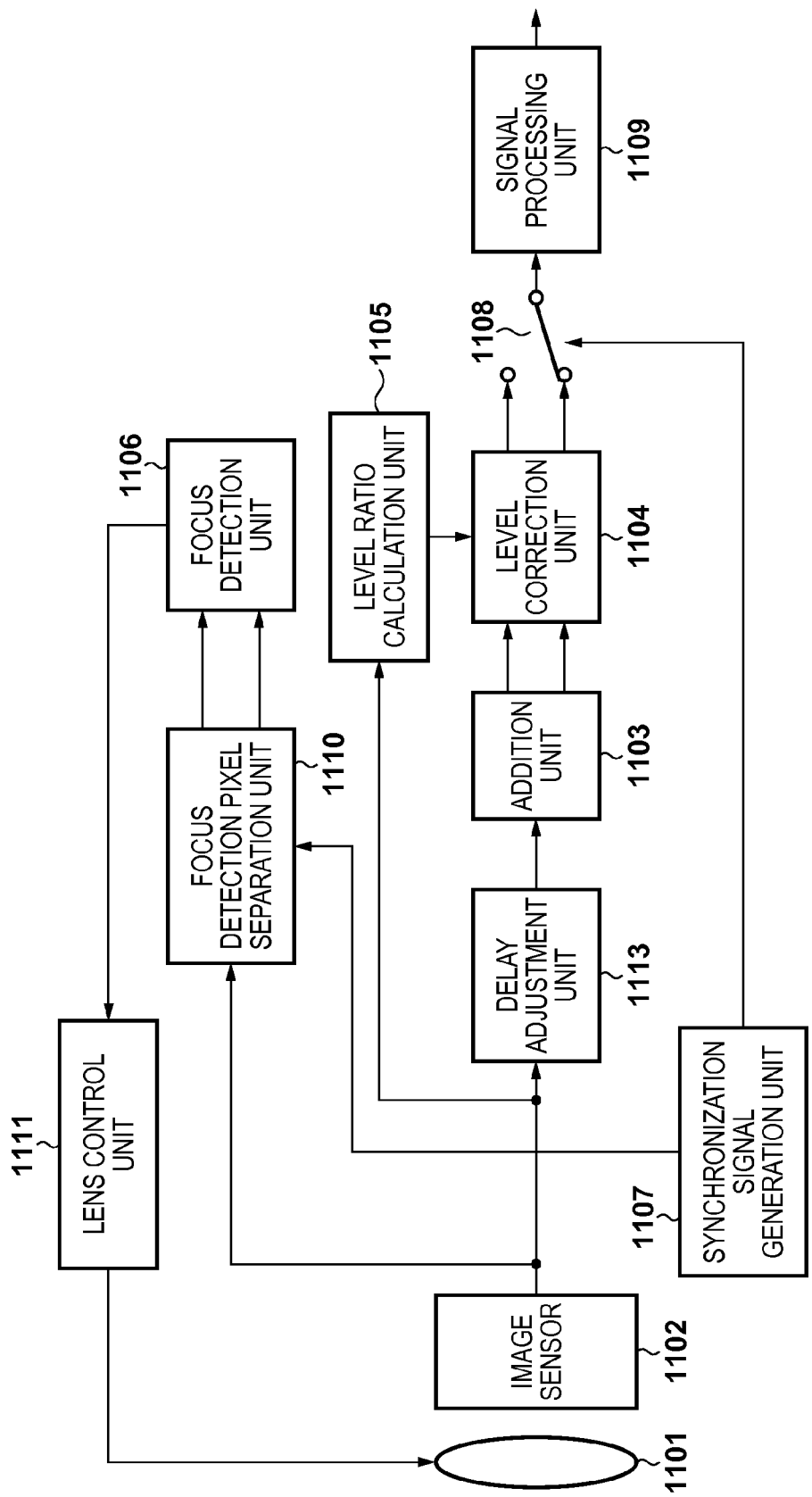
FIG. 18A is a block diagram showing an example configuration of an imaging apparatus according to a fifth embodiment of the invention.

FIG. 18A is a block diagram showing an example configuration of an imaging apparatus according to the present embodiment. This configuration differs from the configuration of the third embodiment shown in FIG. 11 in that a delay adjustment unit 1113 is inserted between an image sensor 1102 and an addition unit 1103, and also in that the level ratio calculation unit 1105 receives, as input, the output from the image sensor 1102 in place of the control information of the lens.

Figure 18B:
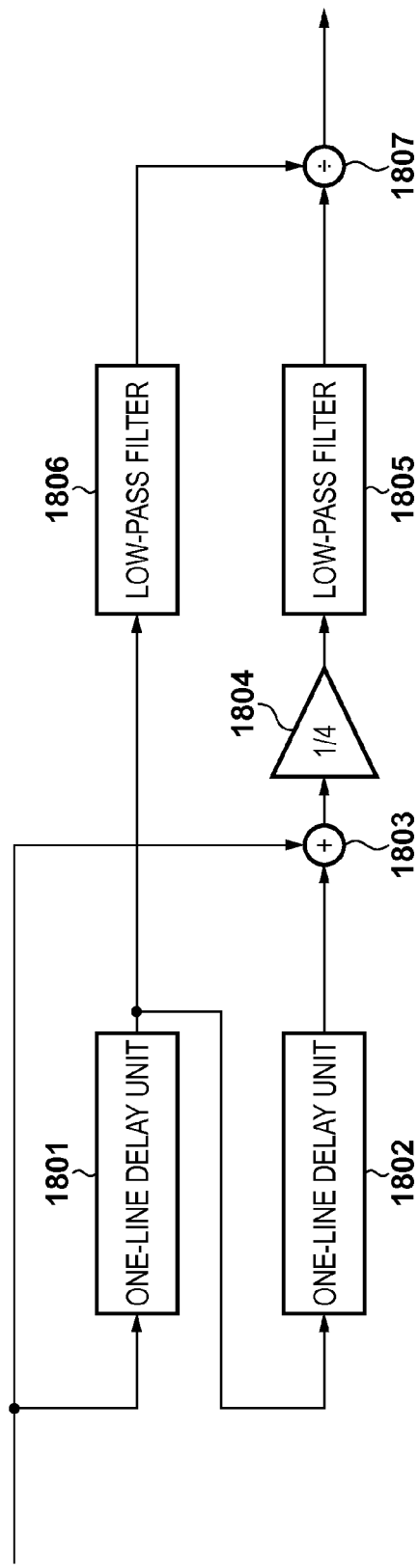
FIG. 18B is a block diagram showing an example configuration of a level ratio calculation unit according to the fifth embodiment of the invention.

The configuration and operation of the level ratio calculation unit 1105 according to the present embodiment will now be described with reference to FIG. 18B. The output from the image sensor 102 is received as the input, and one-line delay units 1801, 1802 delay an input signal. The input signal and the output from the one-line delay unit 1802 are signals from a line above and a line below the line of the output from the one-line delay unit 1801. An adder 1803 and a ¼ multiplier 1804 obtain a signal representing an average of the signals from the line above and the line below. Low-pass filters 1805 and 1806 receive the output from the ¼ multiplier 1804 and the output from the one-line delay unit 1801, respectively, and output only low-frequency components of corresponding pixel values, and a divider 1807 calculates a ratio between the output low-frequency components.

As indicated above, in the present embodiment, a level ratio is calculated using a waveform obtained by applying a low-pass filter to an average of an imaging pixel above and an imaging pixel below, and a waveform obtained by applying a low-pass filter to a focus detection pixel. As a change in a shading image ratio is always gentle by nature, a level ratio can be detected directly from a signal that has been smoothed by a low-pass filter such that a change in the signal is always gentle.

Sixth Embodiment

The following describes a sixth embodiment of the invention. The invention according to the present embodiment improves the pixel correction performance for an image sensor including focus detection pixels.

The technique disclosed in Japanese Patent Laid-Open No. 2007-279597, which has been mentioned earlier, is problematic in that a pixel value interpolated using surrounding pixels leaves a noticeable trace of correction in the case of a subject that lies in a direction of the array of focus detection pixels. Furthermore, as the focus detection pixels only have pixel values correspond to their half openings, there is also the problem of the inability to appropriately reproduce pixel values in a defocused region. On the other hand, a method described in Japanese Patent Laid-Open No. 2010-243772 has the following problem: when a subject has repetitive patterns of high-frequency components, appropriate correction is not performed, and a trace of correction remains. The present embodiment provides the invention for solving such problems.

Figure 19:
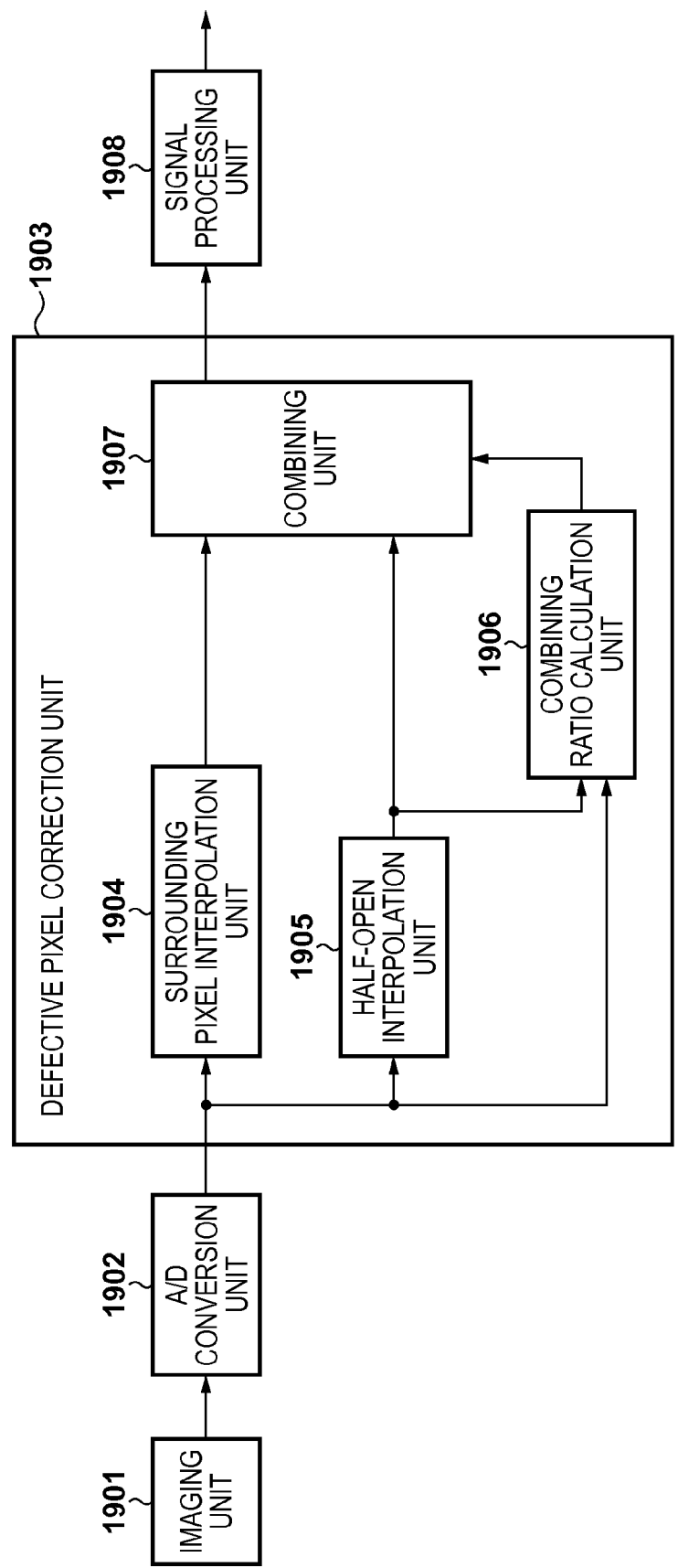
FIG. 19 is a block diagram showing an example configuration of an imaging apparatus according to a sixth embodiment of the invention.

FIG. 19 shows an overall configuration of an imaging apparatus. This imaging apparatus can be configured as, for example, a digital camera; however, this imaging apparatus is not limited to a digital camera as long as it uses an image sensor including imaging pixels and focus detection pixels. Examples of such an imaging apparatus include a digital video camera, a personal computer, a mobile telephone, a smartphone, a PDA, and a tablet terminal.

Figure 23A:
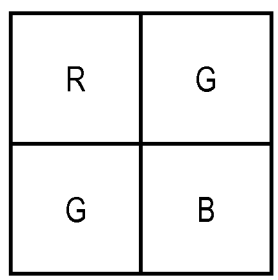
FIGS. 23A and 23B are diagrams for describing an image sensing surface of the imaging apparatus according to the sixth embodiment of the invention.

In FIG. 19, an imaging unit 1901 includes a non-illustrated imaging lens, image sensor, and driving circuit therefor, and the image sensor converts an optical image formed by the imaging lens into an electrical signal. It is assumed that the image sensor is constituted by a CCD or CMOS sensor, and is composed of a set of a plurality of pixels compliant with the Bayer arrangement shown in FIG. 23A. The Bayer arrangement includes three color components, that is to say, a red component (R), a blue component (B), and a green component (G), and these color components are repetitively arrayed in the order shown in FIG. 23A.

An analog signal output from the imaging unit 1901 is converted into a digital signal by an A/D conversion unit 1902. An image signal that has been converted into the digital signal by the A/D conversion unit 1902 is input to a defective pixel correction unit 1903. The defective pixel correction unit 1903, which will be described later in detail, corrects a signal value of a pixel that has been determined to be a defective pixel, and outputs a raw signal yielded from defect correction. The defective pixel correction unit 1903 is composed of a surrounding pixel interpolation unit 1904, a half-open interpolation unit 1905, a combining ratio calculation unit 1906, and a combining unit 1907. As will be described later in detail, the A/D conversion unit 1902 outputs an image signal to the surrounding pixel interpolation unit 1904, the half-open interpolation unit 1905, and the combining ratio calculation unit 1906. The output from the surrounding pixel interpolation unit 1904 is received by the combining unit 1907. The output from the half-open interpolation unit 1905 is received by the combining unit 1907 and the combining ratio calculation unit 1906. In accordance with a combining ratio output from the combining ratio calculation unit 1906, the combining unit 1907 combines the output from the surrounding pixel interpolation unit 1904 and the output from the half-open interpolation unit 1905. The raw signal that is output from the defective pixel correction unit 1903 as a result of defective pixel correction is transmitted to a signal processing unit 1908, and undergoes known signal processing, such as white balance processing, color interpolation processing, noise reduction processing, gamma processing, and matrix processing.

It should be noted that each block of the imaging apparatus shown in FIG. 19 may be configured as hardware using a dedicated logic circuit and memory, except for physical devices such as the image sensor. Alternatively, each block may be configured as software, in which case an apparatus operation is controlled by a computer, such as a CPU, executing a processing program stored in a memory. The configuration of the image sensor according to the present embodiment is equivalent to the one shown in FIG. 6, and therefore a description thereof is omitted.

Figure 20A:
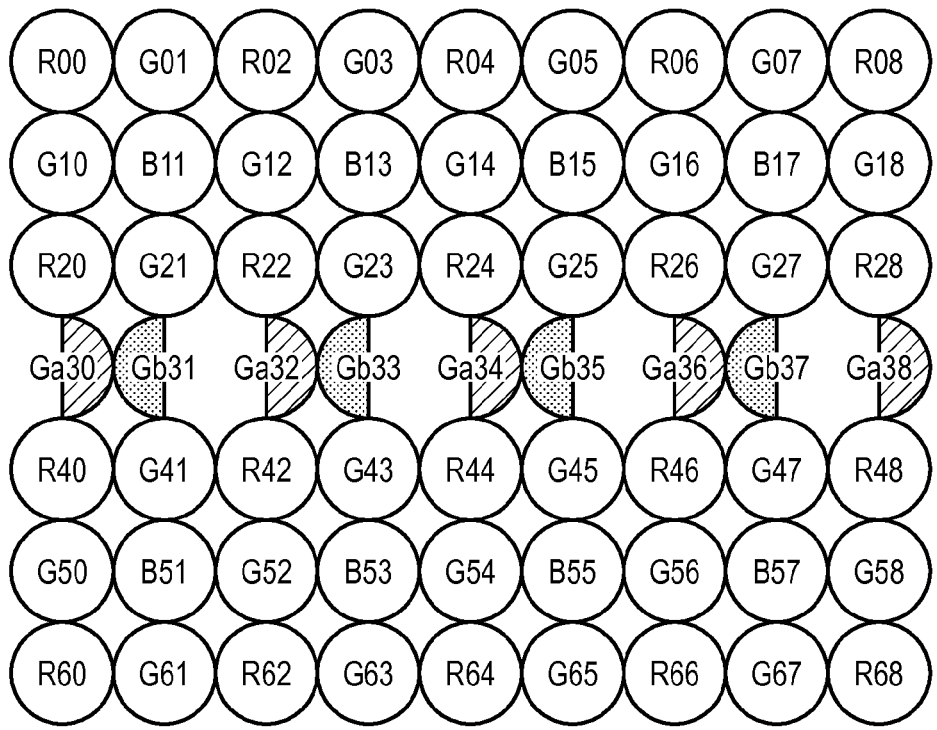
FIGS. 20A and 20B are diagrams for describing processing executed by a defective pixel correction unit according to the sixth embodiment of the invention.

A specific example of processing executed by the half-open interpolation unit 1905 will now be described with reference to FIG. 20A. It is assumed here that Ga34, which is located at the center, is a target pixel for which defective pixel correction is performed, and one horizontal line including Ga34 is composed of focus detection pixels Ga30, Gb31, Ga32, Gb33, Ga34, Gb35, Ga36, Gb37, Gb38. In neighboring focus detection pixels among these focus detection pixels, the barycentric positions of exposed surfaces of photoelectric converters 505 are shifted from their respective pixel center positions in reverse directions. Specifically, in the positions of Ga30, Ga32, Ga34, Ga36, and Ga38, open portions are on the right side, whereas light blocking portions are on the left side. Conversely, in the positions of Gb31, Gb33, Gb35, and Gb37, open portions are on the left side, whereas light blocking portions are on the right side. Furthermore, the focus detection pixels are equipped with color filters of the same color; in the present example, their colors filters are green (G). In half-open interpolation for the position of Ga34, addition is performed by interpolating the central half-open pixel using half-open pixels that are on the left and right thereof, i.e., half-open pixels that have the same barycenter and are open on the other side.

Specifically, a G pixel value Gpos_1 of Ga34 is obtained as follows.

$$G_{pos\_1}=(Gb33+Ga34\times2+Gb35)/4 \quad \text{(Expression 1)}$$

It should be noted that, as the half-open interpolation unit 1905 performs interpolation using three horizontal pixels Gb33, Ga34, and Gb35, there are cases in which it is difficult to ensure the accuracy of interpolation with respect to a subject whose edge components in the horizontal direction are continuous, such as high-frequency vertical lines.

Figure 23B:
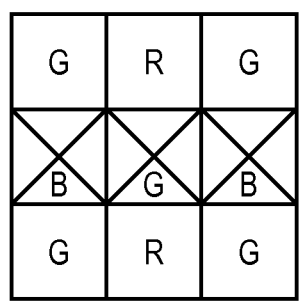

A specific example of an operation of the surrounding pixel interpolation unit 1904 will now be described with reference to FIG. 20A. The following correction method is for a case in which Ga34, which is located at the center, serves as the target pixel for which the defective pixel correction is performed. As one example, in a 3×3 region including the central pixel shown in FIG. 23B, a sum of absolute differences (hereinafter referred to as SAD) is obtained for six pixel regions other than three horizontal pixels (pixels provided with x marks in the figure), and correction is performed based on the following determination condition: the location with the smallest sum of absolute differences has the highest correlation. Specifically, comparing the 3×3 region centered at the target pixel with the 3×3 region centered at the position of G12, SAD 12 can be expressed by the following expression.

SAD12=ABS(G01−G23)+ABS(R02−R24)+ABS
(G03−G25)+ABS(G21−G43)+ABS(R22−R44)+
ABS(G23−G45)        (Expression 2)

It is assumed in the following description that SADs are obtained from 3×3 regions in the embodiment. Similarly, SAD 14 is obtained by comparing the region centered at the target pixel with the region centered at the position of G14, and SAD 16 is obtained by comparing the region centered at the target pixel with the region centered at the position of G16. Similarly, SAD 52 is obtained by comparing the region centered at the target pixel and the region centered at the position of G52, SAD 54 is obtained by comparing the region centered at the target pixel and the region centered at the position of G54, and SAD 56 is obtained by comparing the region centered at the target pixel and the region centered at the position of G56.

Next, a G pixel value Gpos_2 in the position that has the smallest one of the obtained SAD values is obtained. Gpos_2 is G12 when the smallest SAD value is SAD 12, Gpos_2 is G14 when the smallest SAD value is SAD 14, and Gpos_2 is G16 when the smallest SAD value is SAD 16. Gpos_2 is G52 when the smallest SAD value is SAD 52, Gpos_2 is G54 when the smallest SAD value is SAD 54, and Gpos_2 is G56 when the smallest SAD value is SAD 56.

Figure 20B:
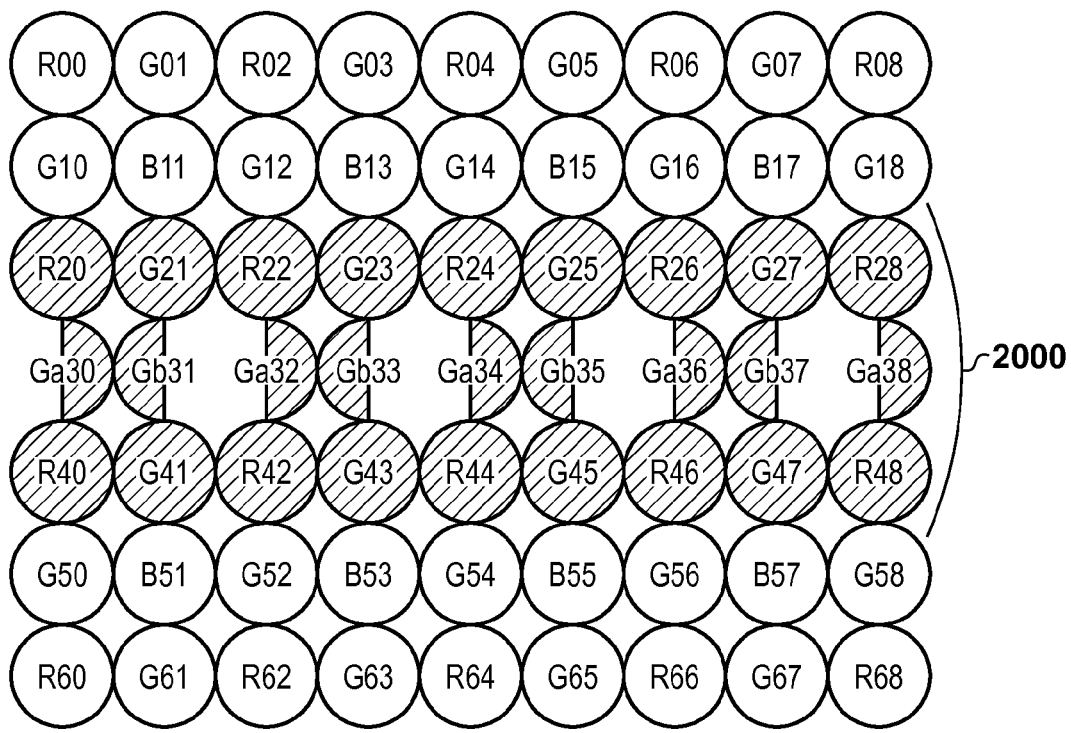

Assume a case in which a subject lies in the same direction as focus detection pixels shown in FIG. 20B (e.g., a horizontal line). In this case, edges of vertical components are continuous in the horizontal direction in a subject image. That is to say, edges of components orthogonal to the direction of the array of the focus detection pixels are arranged in the direction of the array of the focus detection pixels. Below, it is assumed that a region 2000 (a region with hatching in the figure) specifically has lower luminance than surrounding regions. The output of Gpos_2 is one of the values of G12, G14, G16, G52, G54, and G56; however, no matter what value is obtained, the obtained value is not close to the original value of the subject because of the pixels outside the region with hatching. In other words, there are cases in which the surrounding pixel interpolation unit 1904 cannot execute appropriate interpolation processing for a high-frequency horizontal line.

As indicated above, interpolation may not be effective when a subject having edge components in a specific direction is included, whether the interpolation is half-open interpolation or surrounding pixel interpolation. In view of this, as will be described below, a subject having edge components in a specific direction is detected, and half-open interpolation and surrounding pixel interpolation are combined based on the result of detection. This makes it possible to process edge components in a specific direction, which are difficult to process using a single interpolation method.

Figure 21:
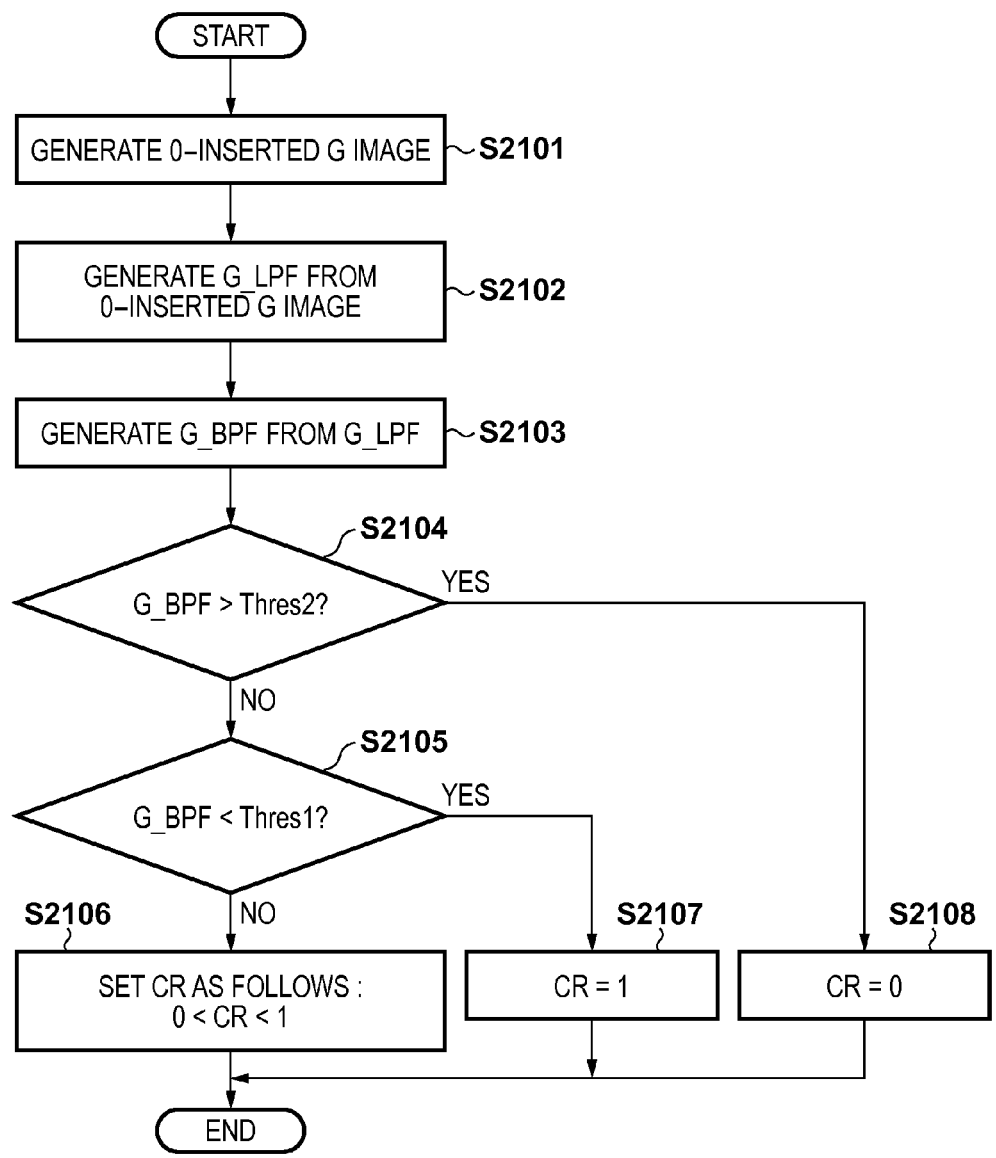
FIG. 21 is a flowchart showing an example of processing executed by a combining ratio calculation unit according to the sixth embodiment of the invention.

With reference to a flowchart of FIG. 21, the following describes in detail combining processing executed by the combining ratio calculation unit 1906 according to the embodiment of the invention. The processing corresponding to this flowchart can be realized by, for example, a CPU functioning as the combining ratio calculation unit 1906 executing a corresponding program (stored in a ROM and the like). In the following description, a frequency band is detected in which interpolation can be performed for a horizontal line serving as a subject with edges having vertical components, which are poorly processed by the surrounding pixel interpolation unit 1904.

First, in step S2101, a 0-inserted G image is generated by inserting 0 for pixels that are included in a predetermined region and are other than G, the predetermined region including a focus detection pixel serving as a processing target. A method for generating the 0-inserted G image will now be described with reference to FIGS. 22A to 22C. The target is an image shown in FIG. 22A, in which pixels are arrayed in the same manner as FIG. 20A; in the present embodiment, this image has 5×5 pixels centered at the focus detection pixel Ga34. In this image, pixel values obtained by performing the above-described half-open interpolation are given to the pixels G32, G34, G36. The resultant image is shown in FIG. 22B. Next, a pixel value of 0 is given to all of the pixels that do not have G components, that is to say, all of the pixels that have R components or B components, among the pixels constituting the image. A pixel value of 0 is also given to Gb33 and Gb35 for which half-open interpolation has not been performed. As a result, the 0-inserted G image shown in FIG. 22C is generated.

Returning to the flowchart of FIG. 21, in step S2102, G_LPF is generated by applying low-pass filter processing (LPF) to the 0-inserted G image generated in step S2101 in the horizontal direction (H direction), which is the same as the direction of the array of the focus detection pixels. Consequently, high-frequency components in the horizontal direction are removed. Next, in step S2103, G_BPF is generated by applying band-pass filter processing (BPF) to G_LPF in the vertical direction (V direction) orthogonal to the direction of the array of the focus detection pixels. Consequently, specific frequency components of vertical components are extracted; specifically, these components correspond to a high-frequency horizontal line for which it is difficult to perform interpolation with the surrounding pixel interpolation unit 1904. It should be noted that the frequency components that should be extracted by BPF are set in such a manner that a horizontal line in the direction of the array of the focus detection pixels shown in, for example, FIG. 20B can be detected in the 0-inserted G image.

A description is now given of G_BPF with reference to FIGS. 24A to 24C. FIG. 24A shows a circular zone plate (CZP); here, DC components are shown in the position of a region 2401, and the Nyquist frequency is shown in the positions of regions 2402, 2403, 2404. In FIG. 24B, the frequency bands at 2401, 2402, 2403, and 2404 are the same as FIG. 24A; the low-pass filter processing (LPF) is applied in the horizontal direction and the band-pass filter processing (BPF) is applied in the vertical direction, so that the band of a region 2410 corresponds to the output G_BPF. It can be said that this region is more suited for interpolation by the half-open interpolation unit 1905 than interpolation by the surrounding pixel interpolation unit 1904 because this region includes horizontal lines, and hence many edges having vertical components.

The description now refers back to the flowchart of FIG. 21. In G_LPF obtained by applying the band-pass filter, specific frequency components have been extracted, and other components attenuate; therefore, in step S2104, if G_BPF is larger than a threshold Thres2, processing proceeds to step S2108, and a combining ratio (CR) is set to 0 so as to use only the output from the half-open interpolation unit 1905. In this case, the output from the half-open interpolation unit 1905 is prioritized as the presence of edges having vertical components is significant. On the other hand, if G_BPF is smaller than the threshold Thres2 in step S2104, processing proceeds to step S2105 and G_BPF is compared with a threshold Thres1. If G_BPF is smaller than the threshold Thres1, processing proceeds to step S2107, and a combining ratio CR is set to 1 so as to use only the output from the surrounding pixel interpolation unit 1904. In this case, the surrounding pixel interpolation unit 1904 can be used because there is no edge having vertical components, or edges having vertical components are weak. If G_BPF is larger than the threshold Thres1, linear interpolation is applied so as to obtain an intermediate value between the threshold Thres1 and the threshold Thres2 in step S2106. In this case, the output from the surrounding pixel interpolation unit 1904 and the output from the half-open interpolation unit 1905 are combined in accordance with the intensity of edges having vertical components. That is to say, the lower the intensity of edges having vertical components, the higher the priority of the output from the surrounding pixel interpolation unit 1904; conversely, the higher the intensity of edges having vertical components is, the higher the priority of the output from the half-open interpolation unit 1905. FIG. 24C shows a relationship among G_BPF, the thresholds Thres1 and Thres2, and the combining ratio CR in the foregoing processing. FIG. 24C indicates that a combining ratio CR of 1 is output if G_BPF is smaller than Thres1, a combining ratio CR of 0 is output if G_BPF is larger than Thres2, and the following is output as the combining ratio CR if G_BPF falls between the threshold Thres1 and the threshold Thres2.

$$CR=(Thres1-G\_BPF)/(Thres2-Thres1) \qquad \text{(Expression 3)}$$

It should be noted that the thresholds Thres1 and Thres2 may vary in accordance with the surrounding luminance values and G values. For example, higher thresholds can be set when the surrounding luminance values are large. In this case, higher thresholds cause the graph of FIG. 24C to shift more to the right, and increase the percentage at which the output from the surrounding pixel interpolation unit 1904 is combined. It is sufficient to obtain the luminance values of surrounding pixels using a known method, e.g., by applying LPF to the surrounding pixels, and therefore a detailed description of a method for obtaining such luminance values is omitted. Furthermore, the thresholds Thres1 and Thres2 may vary in accordance with the amount of noise that occurs in the image sensor at the time of, for example, high sensitivity or long-second exposure. For example, at the time of high sensitivity or long-second exposure, a captured image contains an increased amount of noise, and hence higher thresholds can be set so as to further increase the percentage at which the output from the surrounding pixel interpolation unit 1904 is combined.

Moreover, the thresholds Thres1 and Thres2 may vary depending on whether a saturated pixel is included in a region surrounding a focus detection pixel serving as a processing target. For example, in a case where a saturated pixel is included in a 3×3 region centered at the target pixel and a 3×3 region from which SAD has been obtained in the surrounding pixel interpolation unit 1904, lower thresholds can be set so as to give a higher priority to the half-open interpolation unit 1905. In this way, the percentage at which the output from the surrounding pixel interpolation unit 1904 is combined is lower when a saturated pixel is included than when a saturated pixel is not included.

Returning to FIG. 19 again, the combining unit 1907 combines the pixel value Gpos_1 output from the surrounding pixel interpolation unit 1904 and the pixel value Gpos_2 output from the half-open interpolation unit 1905 in accordance with the combining ratio CR output from the combining ratio calculation unit 1906.

$$Gpos=(Gpos\_2\times(1-CR))+(Gpos\_1\times CR) \qquad \text{(Expression 4)}$$

It should be noted that a focus detection pixel in a position corresponding to a Bayer color filter B can be interpolated in accordance with a known interpolation method using surrounding pixels, and therefore a detailed description of interpolation of such a focus detection pixel is omitted.

As described above, two types of interpolation processing are executed in the surrounding pixel interpolation unit 1904 and the half-open interpolation unit 1905, and upon detection of an edge in a component direction orthogonal to the direction of the array of the focus detection pixels, a larger weight is given to the half-open interpolation unit 1905 in execution of combining processing. In this way, even in a region that is impervious to the effect of the surrounding pixel interpolation unit 1904, the half-open interpolation unit 1905 can perform high-precision interpolation, and more appropriate pixel correction can be performed. Furthermore, processing for switching between two interpolation units may be executed in such a manner that the half-open interpolation unit 1905 is selected upon detection of an edge in a component direction orthogonal to the direction of the array of the focus detection pixels, and the surrounding pixel interpolation unit 1904 is selected when such an edge is not detected. Whether such an edge has been detected may be determined based on whether G_BPF is larger than the threshold Thres1.

Figure 25A:
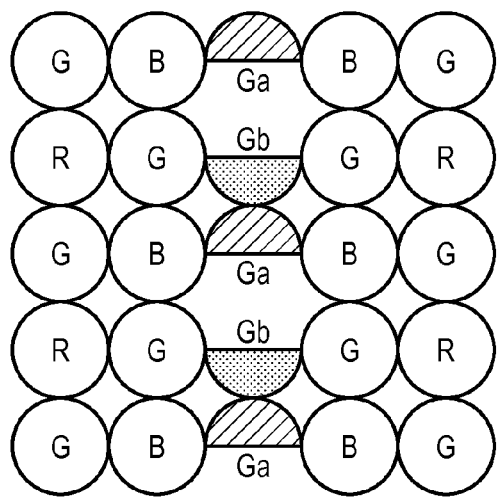
FIGS. 25A to 25C show example configurations of an image sensor according to the sixth embodiment of the invention.
Figure 25B:
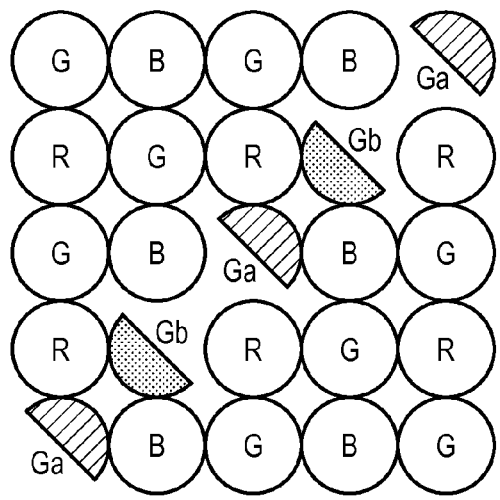
Figure 25C:
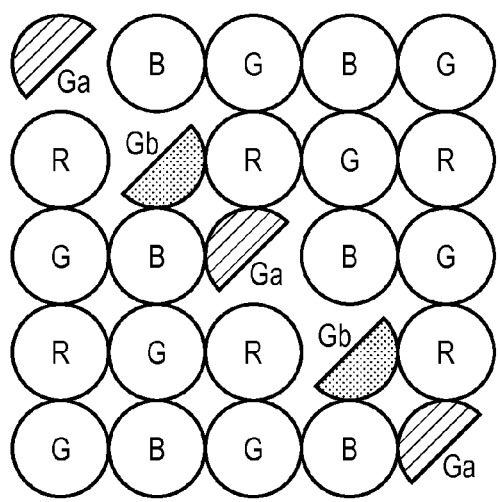

Although the focus detection pixels are arrayed in a horizontal direction in the present embodiment, the direction of the array is not limited to the horizontal direction as long as the focus detection pixels are arrayed regularly in a predetermined direction. For example, the focus detection pixels may be arrayed in a vertical direction as shown in FIG. 25A, arrayed in a diagonal direction of 45 degrees as shown in FIG. 25B, or arrayed in a diagonal direction of 135 degrees as shown in FIG. 25C. Algorithms used in these cases are the same as the one described in the present embodiment except for the directions, and therefore a detailed description thereof is omitted.

In the present embodiment, the method used by the surrounding pixel interpolation unit 1904 to obtain correlations with surrounding pixels yields a 3×3 pixel range with the smallest SAD value as a range having the highest correlation; however, the method is not limited in this way. Furthermore, the present embodiment adopts processing for replacing the target pixel with a central pixel in a pixel range having the highest correlation; however, the present embodiment is not limited to adopting this method. For example, the target pixel may be corrected using surrounding pixels as well, so that five G pixels in a 3×3 region have the same average value.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-123814, filed on Jun. 16, 2014, No. 2014-144568, filed on Jul. 14, 2014, and No. 2015-094444, filed on May 1, 2015, which are hereby incorporated by reference herein in their entirety.

What is claimed is:

1. An imaging apparatus, comprising:
an image sensor including a plurality of focus detection pixels for generating a focus detection image and a plurality of imaging pixels for generating a captured image in which a subject is captured, the plurality of focus detection pixels being arrayed in a predetermined direction in such a manner that different colors thereof alternate;
a color ratio detection unit configured to detect a color ratio based on a pixel value output from a pixel in a position surrounding a processing target pixel;
a color conversion unit configured to generate a first pixel value by applying color conversion, using the color ratio, to a pixel value output from a pixel that is located in the predetermined direction of the processing target pixel; and
an addition unit configured to generate a third pixel value by adding a second pixel value output from the processing target pixel with the first pixel value having the same color as the second pixel value.

2. The imaging apparatus according to claim 1, wherein the addition unit adds the second pixel value output from the processing target pixel with the first pixel value generated from pixel values output from pixels that are on both neighboring sides of the processing target pixel in the predetermined direction.

3. The imaging apparatus according to claim 1, wherein the plurality of imaging pixels are arrayed in accordance with a Bayer arrangement.

4. An imaging apparatus, comprising:
an image sensor including a plurality of focus detection pixels for generating a focus detection image and a plurality of imaging pixels for generating a captured image in which a subject is captured, the plurality of focus detection pixels having the same color and being arranged in a predetermined direction;
a color ratio detection unit configured to detect a color ratio based on a pixel value output from a pixel in a position surrounding a processing target pixel;
an addition unit configured to generate a second pixel value by adding a first pixel value output from the processing target pixel with a pixel value output from a pixel that is located in the predetermined direction of the processing target pixel; and
a color conversion unit configured to generate a third pixel value by applying color conversion, based on the color ratio, to the second pixel value.

5. The imaging apparatus according to claim 4, wherein the plurality of imaging pixels are arrayed in accordance with a Bayer arrangement, and the plurality of focus detection pixels having the same color are arranged so as to neighbor one another in the predetermined direction.

6. A control method for an imaging apparatus provided with an image sensor including a plurality of focus detection pixels for generating a focus detection image and a plurality of imaging pixels for generating a captured image in which a subject is captured, the plurality of focus detection pixels being arrayed in a predetermined direction in such a manner that different colors thereof alternate, the control method comprising:
a color ratio detection step of detecting a color ratio based on a pixel value output from a pixel in a position surrounding a processing target pixel;
a color conversion step of generating a first pixel value by applying color conversion, using the color ratio, to a pixel value output from a pixel that is distanced from the processing target pixel in the predetermined direction; and
an addition step of generating a third pixel value by adding a second pixel value output from the processing target pixel with the first pixel value having the same color as the second pixel value.

7. A control method for an imaging apparatus provided with an image sensor including a plurality of focus detection pixels for generating a focus detection image and a plurality of imaging pixels for generating a captured image in which a subject is captured, the plurality of focus detection pixels having the same color and being arranged in a predetermined direction, the control method comprising:
a color ratio detection step of detecting a color ratio based on a pixel value output from a pixel in a position surrounding a processing target pixel;
an addition step of generating a second pixel value by adding a first pixel value output from the processing target pixel with a pixel value output from a pixel that is located in the predetermined direction of the processing target pixel; and
a color conversion step of generating a third pixel value by applying color conversion, based on the color ratio, to the second pixel value.

8. A non-transitory computer-readable storage medium storing a computer program for causing an imaging apparatus to execute the following steps, the imaging apparatus being provided with an image sensor including a plurality of focus detection pixels for generating a focus detection image and a plurality of imaging pixels for generating a captured image in which a subject is captured, the plurality of focus detection pixels being arrayed in a predetermined direction in such a manner that different colors thereof alternate:
a color ratio detection step of detecting a color ratio based on a pixel value output from a pixel in a position surrounding a processing target pixel;
a color conversion step of generating a first pixel value by applying color conversion, using the color ratio, to a pixel value output from a pixel that is distanced from the processing target pixel in the predetermined direction; and
an addition step of generating a third pixel value by adding a second pixel value output from the processing target pixel with the first pixel value having the same color as the second pixel value.

9. A non-transitory computer-readable storage medium storing a computer program for causing an imaging apparatus to execute the following steps, the imaging apparatus being provided with an image sensor including a plurality of focus detection pixels for generating a focus detection image and a plurality of imaging pixels for generating a captured image in which a subject is captured, the plurality of focus detection pixels having the same color and being arranged in a predetermined direction:

a color ratio detection step of detecting a color ratio based on a pixel value output from a pixel in a position surrounding a processing target pixel;

an addition step of generating a second pixel value by adding a first pixel value output from the processing target pixel with a pixel value output from a pixel that is located in the predetermined direction of the processing target pixel; and a color conversion step of generating a third pixel value by applying color conversion, based on the color ratio, to the second pixel value.

* * * * *